United States Patent
Liu et al.

(10) Patent No.: US 12,324,149 B2
(45) Date of Patent: Jun. 3, 2025

(54) METAL FUSE STRUCTURE BY VIA LANDING

(71) Applicant: Taiwan Semiconductor Manufacturing Company, Ltd., Hsinchu (TW)

(72) Inventors: Hsiang-Wei Liu, Tainan (TW); Yao-Jen Yang, Hsinchu County (TW); Meng-Sheng Chang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 544 days.

(21) Appl. No.: 17/461,863

(22) Filed: Aug. 30, 2021

(65) Prior Publication Data

US 2023/0064518 A1    Mar. 2, 2023

(51) Int. Cl.
*H10B 20/20* (2023.01)
*G11C 17/16* (2006.01)
(Continued)

(52) U.S. Cl.
CPC ............. *H10B 20/20* (2023.02); *G11C 17/16* (2013.01); *G11C 17/18* (2013.01); *H01L 23/5252* (2013.01)

(58) Field of Classification Search
CPC . H10B 20/20; H10B 20/25; H01L 2924/1453; G11C 17/14; G11C 17/143; G11C 17/146; G11C 17/16; G11C 17/165; H10L 23/525; H10L 23/5252; H10L 23/5254; H10L 23/5256; H10L 23/5258
See application file for complete search history.

(56) References Cited

U.S. PATENT DOCUMENTS 10,020,313 B2 * 7/2018 Lee .................. H01L 23/5252
2015/0262701 A1 * 9/2015 Takizawa ............ G11C 11/1675
365/96

(Continued)

FOREIGN PATENT DOCUMENTS

CN    111987100 A  * 11/2020  ......... H01L 23/5252
DE    102019101570 B4 *  9/2022  ......... G06F 17/5072

*Primary Examiner* — Fernando L Toledo
*Assistant Examiner* — Marshall Mu-Nuo Hatfield
(74) *Attorney, Agent, or Firm* — FOLEY & LARDNER LLP

(57) ABSTRACT

In one aspect of the present disclosure, a semiconductor device is disclosed. In some embodiments, the semiconductor device includes a first conductive structure extending in a first direction, the first conductive structure coupled to a metal-oxide-semiconductor (MOS) device; a second conductive structure extending in the first direction and spaced from the first conductive structure in a second direction perpendicular to the first direction; a dielectric material extending in the second direction and disposed over, in a third direction perpendicular to the first direction and the second direction, the first conductive structure; and a via structure disposed over the second conductive structure and in contact with the dielectric material, wherein the dielectric material is configured to create a channel between the first conductive structure and the via structure when a voltage is applied to the second conductive structure.

20 Claims, 18 Drawing Sheets

(51) Int. Cl.
   *G11C 17/18*     (2006.01)
   *H01L 23/525*    (2006.01)

(56) References Cited

U.S. PATENT DOCUMENTS

| | | | | |
|---|---|---|---|---|
| 2015/0298457 | A1* | 10/2015 | Ohmura | B41J 2/04585 |
| | | | | 347/61 |
| 2016/0071582 | A1* | 3/2016 | Chung | G11C 13/0023 |
| | | | | 365/158 |
| 2016/0351498 | A1* | 12/2016 | Chang | G11C 17/165 |
| 2019/0251223 | A1* | 8/2019 | Chang | G11C 17/18 |
| 2020/0058660 | A1* | 2/2020 | Chang | H01L 23/528 |
| 2020/0118927 | A1* | 4/2020 | Zhang | H01L 23/5226 |
| 2020/0135746 | A1* | 4/2020 | Liaw | H01L 23/5252 |

* cited by examiner

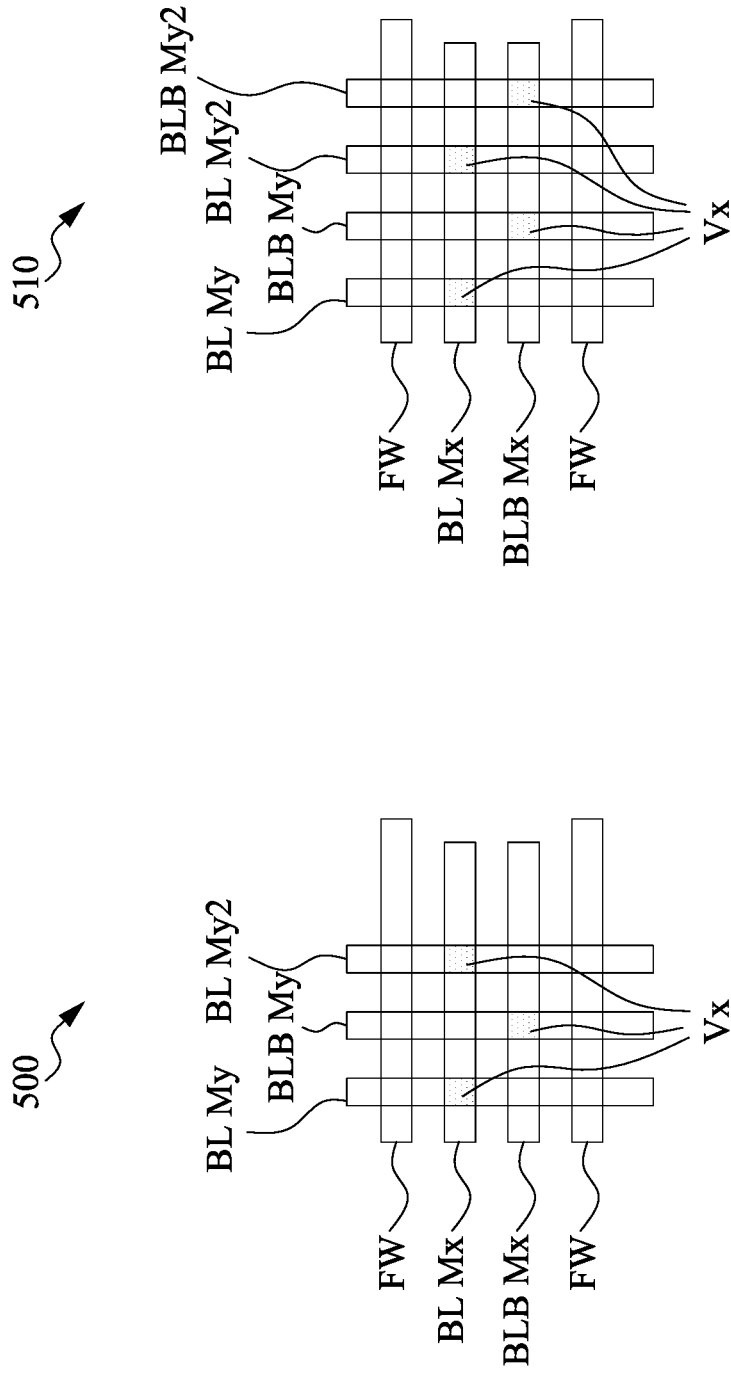

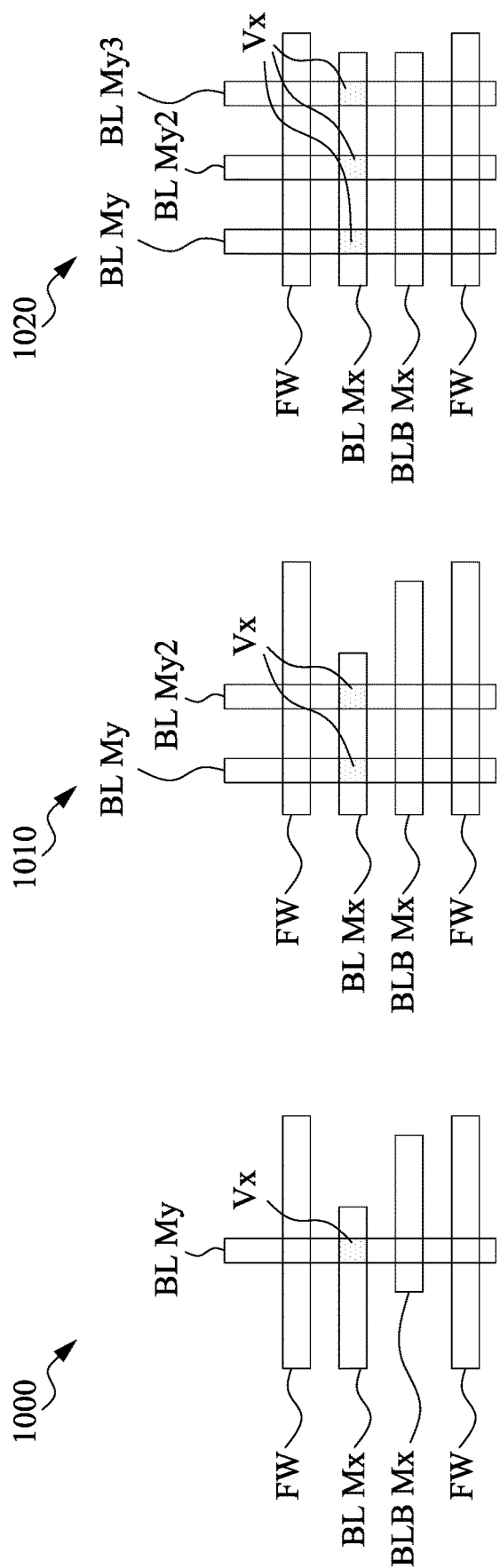

METAL FUSE STRUCTURE BY VIA LANDING

BACKGROUND

A programmable read-only memory (PROM) is a form of digital memory where the setting of each bit is locked by a fuse, antifuse, eFuse, or any other of various fuse types. Like other read-only memories (ROMs), the data in the PROMs are permanent and cannot be changed. PROMs may be used in digital electronic devices to store permanent data, usually for low level programs such as firmware or microcode. A difference from a standard ROM is that the data is written into a ROM during manufacture, while data is programmed into a PROM after manufacture.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5F illustrate various circuit layouts of a fuse cell, in accordance with some embodiments.

FIGS. 10A-10F illustrate various circuit layouts of a fuse cell, in accordance with some embodiments.

DETAILED DESCRIPTION

Figure 1B:
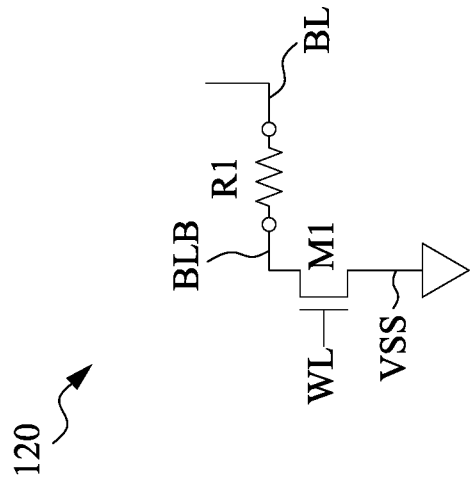
FIGS. 1A and 1B each illustrate a schematic circuit diagram of a fuse cell at various stages of operation, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a fuse structure, and methods of forming the same. Metal fuse structures not having the improvements disclosed herein may need to sustain big program currents to breakdown a fuse element such as a resistor, changing it from a low resistance to a high resistance. In such structures, a metal-oxide-semiconductor (MOS) programming device that is coupled to the fuse element may need to be prohibitively large to sustain such large currents.

In some embodiments, the fuse structure disclosed herein includes a fuse element which comprises a conductive structure in parallel and not in contact with a second conductive structure with a via structure disposed on top of the second conductive structure. In some embodiments, the fuse structure is programmed by shorting the fuse element. That is, in some embodiments, the fuse structure is programmed by applying a programming voltage on the second conductive structure and causing, via breakdown, a channel to be formed between the first conductive structure and the second conductive structure (e.g., thereby changing a fuse resistance from a high resistance to a low resistance). In some embodiments, a width of the via structure is larger than a width of the second conductive structure such that a spacing between the first conductive structure and the via structure is lower than a second spacing between the first conductive structure and the second conductive structure.

Advantageously, embodiments of the disclosed structure and method can achieve several benefits. In one aspect, by using a voltage instead of a current to breakdown the fuse element, and thereby program the fuse structure, embodiments of the disclosed structure and method can use a smaller MOS programming device. In another aspect, embodiments of the disclosed structure and method can achieve (e.g., greater than a 90 percent) reduction in area for a fuse structure as compared to embodiments lacking the improvements disclosed herein. In another aspect, by sizing and disposing a number of via structures appropriately, the programming voltage required for dielectric breakdown can be reduced. For example, the via structures can be enlarged, the via structures can be disposed at an offset along the direction in which the conductive structures are spaced, and/or more via structures can be disposed, for example, in a triangle, parallelogram, or trapezoidal arrangement.

Figure 1A:
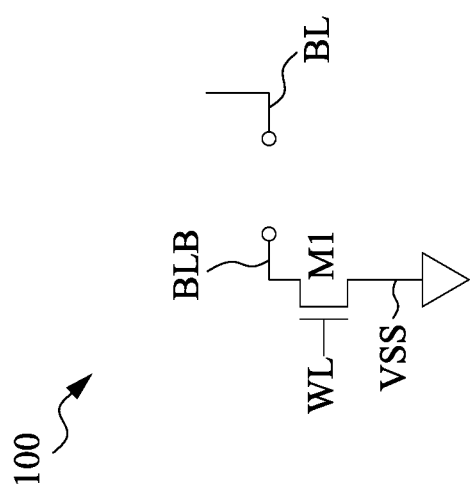

FIG. 1A illustrates a schematic circuit diagram of a single-transistor fuse cell 100 that has not been programmed, in accordance with some embodiments. The fuse cell 100 includes the transistor M1. The transistor M1 can be a metal-oxide-semiconductor (MOS) transistor, an N-type MOS (NMOS) transistor, a P-type MOS (PMOS) transistor, or any of various other types of transistors. The transistor M1 can have a MOS device type of standard threshold voltage (SVT), low threshold voltage (LVT), high threshold voltage (HVT), high voltage (HV), input/output (IO), or any of various other MOS device types. The transistor M1 may include a gate electrode, a drain electrode, and a source electrode. A first conductor (e.g., a word line WL) may be coupled to the gate electrode of M1. A second conductor (e.g., a bit line bar BLB) may be coupled to the drain electrode of M1. A third conductor (e.g., a ground VSS) may be coupled to the source electrode of M1. The fuse cell 100 may include a fourth conductor (e.g., a bit line BL). In some embodiments, the second conductor BLB and the fourth conductor BL are not coupled (e.g., open) or are weakly coupled (e.g., a resistance between BLB and BL is greater than 100 kilo-ohms, or any of other various resistances).

In some embodiments, during a read operation of the fuse cell 100, the first conductor WL receives an enable signal to enable M1 and the fourth conductor BL receives (e.g., carries) a first signal (e.g., a read signal) having a first voltage. In some embodiments, a sensor or memory controller senses the first signal on the fourth conductor BL. In some embodiments, the first voltage is greater than a predetermined threshold indicating that the fuse cell 100 has not been programmed.

In some embodiments, during a programming operation of the fuse cell 100, the first conductor WL receives the enable signal to enable M1 and the fourth conductor BL receives a second signal (e.g., a programming signal) having a second voltage. In some embodiments, a sensor or memory controller applies the second signal on the fourth conductor BL. In some embodiments, the second voltage is greater than a predetermined breakdown voltage and breaks down a dielectric to form a channel in between BL and BLB, which is explained further in FIG. 1B.

FIG. 1B illustrates a schematic circuit diagram of a single-transistor fuse cell 120 that has been programmed, in accordance with some embodiments. The fuse cell 120 is similar to the fuse cell 100 except that the fuse cell 120 includes a resistor R1 in between the second conductor BLB and the fourth conductor BL. In some embodiments, the resistor R1 represents/embodies/is a resistance of a channel between the second conductor BLB and the fourth conductor BL that is formed when the dielectric in between BL and BLB breaks down in response to applying the programming voltage to the fourth conductor BL. In some embodiments, the resistor R1 is less than 10 ohms, or any of other various resistances.

In some embodiments, during a read operation of the fuse cell 120, the first conductor WL receives an enable signal to enable M1 and the fourth conductor BL receives the first signal having a third voltage. In some embodiments, the third voltage is less than a predetermined threshold indicating that the fuse cell 120 has been programmed.

Figure 1D:
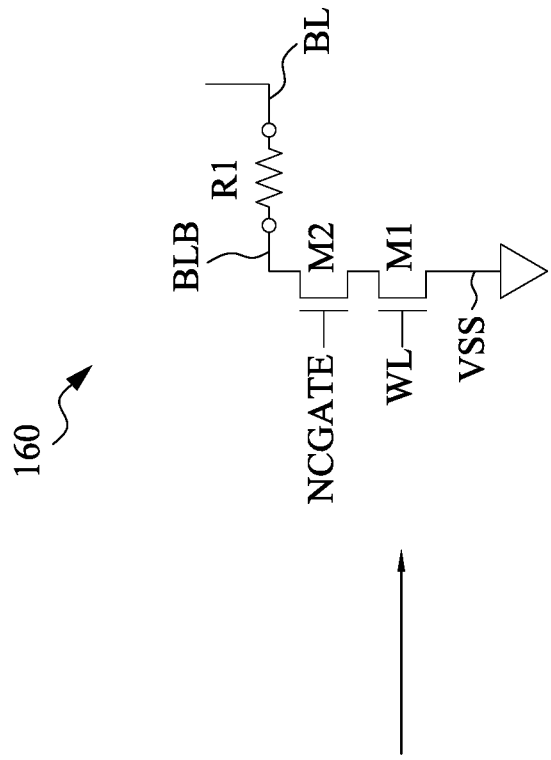
FIGS. 1C and 1D each illustrate a schematic circuit diagram of another fuse cell at various stages of operation, in accordance with some embodiments.
Figure 1C:
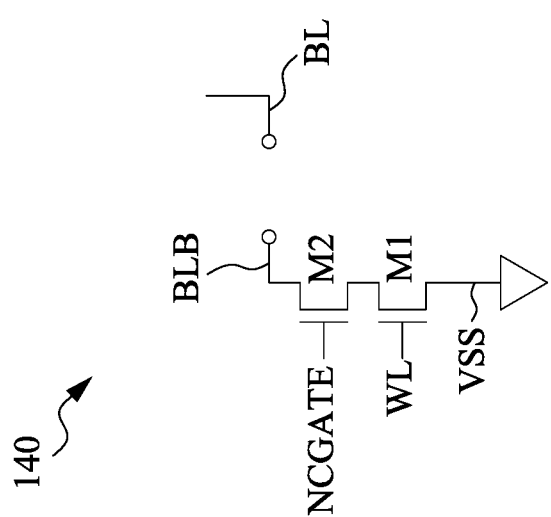

FIG. 1C illustrates a schematic circuit diagram of a dual-transistor fuse cell 140 that has not been programmed, in accordance with some embodiments. The fuse cell 140 includes transistors M1 and M2, each of which may be similar to the transistor M1 of FIG. 1A. A first conductor (e.g., the word line WL) may be coupled to the gate electrode of M1. A second conductor (e.g., a n-cascode gate, or NCGATE) may be coupled to the gate electrode of M2. In some embodiments, the second conductor NCGATE receives a bias signal having a voltage equal to, or a fraction (e.g., one-half) of, a reference plane (e.g., a voltage supply, VDD).

A third conductor (e.g., bit line bar BLB) may be coupled to the drain electrode of M2. A fourth conductor (e.g., ground VSS) may be coupled to the source electrode of M1. The drain electrode of M1 may be coupled to the source electrode of M2 (e.g., the transistors M1 and M2 are in series/stacked). The fuse cell 140 may include a fifth conductor (e.g., bit line BL). In some embodiments, the third conductor BLB and the fifth conductor BL are not coupled or are weakly coupled (e.g., a resistance between BLB and BL is greater than 100 kilo-ohms, or any of other various resistances). In some embodiments, read and programming operations of the dual-transistor fuse cell 140 are similar to the read and programming operations of the single-transistor fuel cell 100.

FIG. 1D illustrates a schematic circuit diagram of a dual-transistor fuse cell 160 that has been programmed, in accordance with some embodiments. The fuse cell 160 is similar to the fuse cell 140 except that the fuse cell 160 includes a resistor R1 in between the third conductor BLB and the fifth conductor BL. The resistor R1 of the fuse cell 160 is similar to the resistor R1 of fuse cell 120. In some embodiments, a read operation of the dual-transistor fuse cell 160 is similar to the read operation of the single-transistor fuel cell 120. Each of the fuse cells 100-160 can be described as a semiconductor device while remaining within the scope of the present disclosure.

Figure 2:
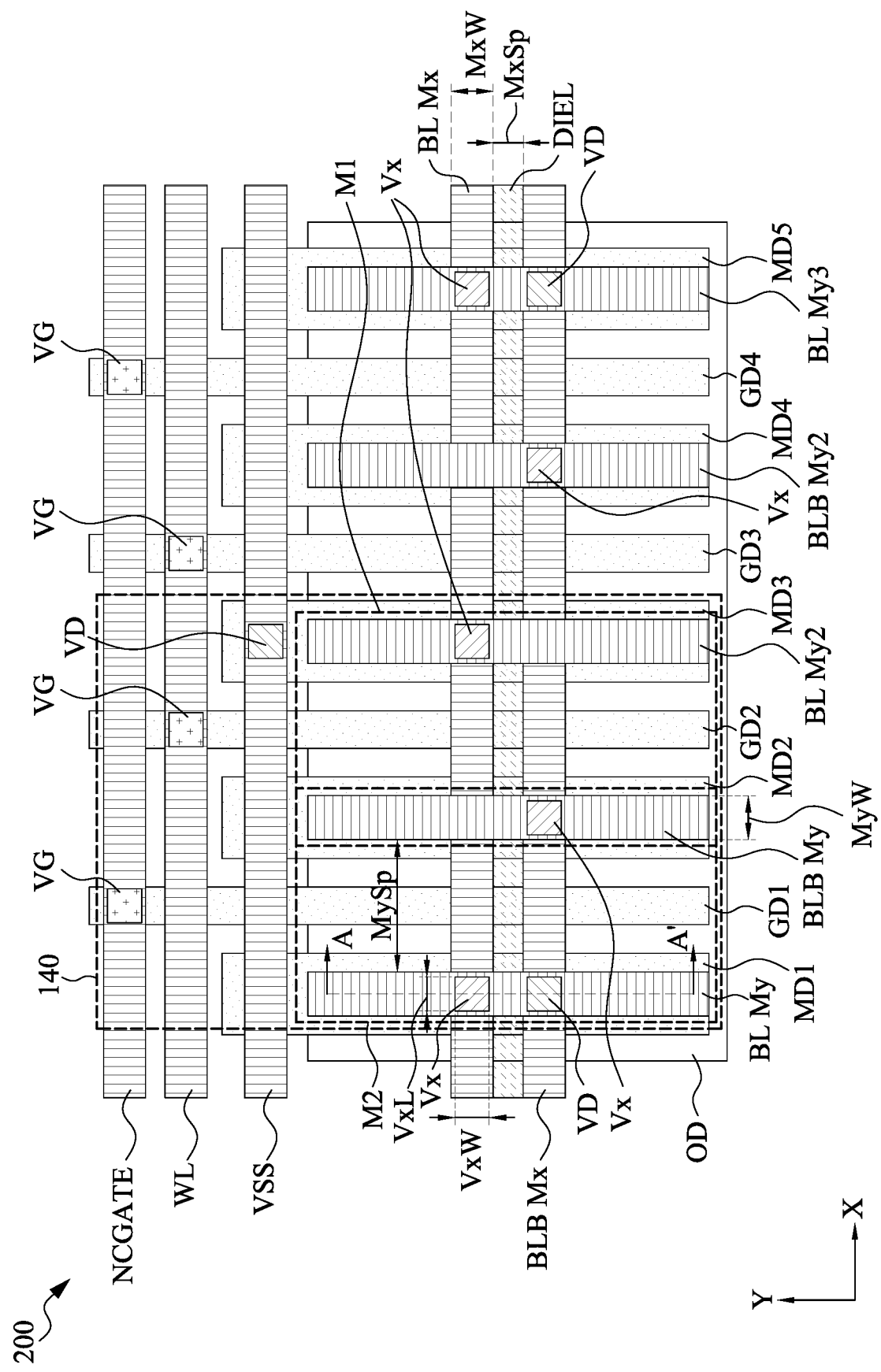
FIG. 2 illustrates a circuit layout of a fuse cell, in accordance with some embodiments.

FIG. 2 illustrates a circuit layout of a semiconductor fuse cell 200, in accordance with various embodiments. Although the fuse cell 200 illustrated in FIG. 2 includes two instances of the fuse cell 140, it should be understood that the fuse cell 200 can include any number of instances of the fuse cell 140, or of any of various other fuse cells (e.g., fuse cell 100), while remaining within the scope of the present disclosure. The fuse cell 200 can be described as a semiconductor device while remaining within the scope of the present disclosure.

The fuse cell 200 includes an active structure (OD). In some embodiments, the active structure OD is a semiconductor material that is doped (e.g., with a p-type or an n-type dopant). In some embodiments, the active structure OD is disposed over a semiconductor substrate. In some embodiments, a well (e.g., n-well or p-well) structure is disposed over the active structure OD.

The fuse cell 200 includes a number of metal-defined contacts/structures (MDs) extending in a first lateral direction (e.g., the Y direction) and spaced from each other along a second lateral direction (e.g., the X direction) perpendicular to the first lateral direction. Although the first lateral direction is described herein as the Y direction, the first and second lateral directions can be interchanged while remaining within the scope of the disclosure. As shown in FIG. 2, the MDs include MD1, MD2, MD3, MD4, and MD5. In some embodiments, MD1 is at a first end, along the second lateral direction, of the MDs, MD2 is in between MD1 and MD3, MD3 is in between MD2 and MD4, MD4 is in MD3 and MD5, and MD5 is at the other end of the MDs. In some embodiments, at least a portion of each MD is disposed over (e.g., overlapping) OD along a vertical direction (e.g., Z direction) perpendicular to the first lateral direction and second lateral direction. In some embodiments, each MD corresponds to one of the drain electrode or source electrode of a transistor such as M1 or M2 of FIG. 1C. In some embodiments, at least one of the MDs can correspond to a drain electrode of a first transistor (e.g., MD and a source electrode of a second transistor (e.g., M2). Although the fuse cell 200 illustrated in FIG. 2 includes five MDs, it should be understood that fuse cell 200 can include any number of MDs while remaining within the scope of the present disclosure. Each of the metal-defined structures can include Cu Al, Co, Ru, W, or any of other various conductive materials.

The fuse cell 200 includes a number of gate-defined structures (GDs) extending in the first lateral direction and spaced from each other along the second lateral direction. As shown in FIG. 2, the GDs include GD1, GD2, GD3, and GD4. In some embodiments, GD1 is at a first end, along the second lateral direction, of the GDs, GD2 is in between GD1 and GD3, GD3 is in between GD2 and GD4, and GD4 is at the other end of the GDs. In some embodiments, each GD is disposed in between, and spaced from, a pair of MDs along the second lateral direction. In some embodiments, at least a portion of each GD is disposed over OD along the vertical direction. In some embodiments, the portion of each GD that is overlapping OD defines a conduction channel of a transistor. In some embodiments, each GD corresponds to the gate electrode of a transistor such as M1 or M2 of FIG. 1C. Although the fuse cell 200 illustrated in FIG. 2 includes four GDs, it should be understood that fuse cell 200 can include any number of GDs while remaining within the scope of the present disclosure. Each of the gate-defined structures can include Cu Al, Co, Ru, W, poly-Si, or any of other various conductive materials. In some embodiments, MD1, GD1, MD2, and a portion of OD (over which MD1, GD1, and MD2 are disposed) correspond to M2 of FIG. 1C. In some embodiments, MD2, GD2, MD3, and a portion of OD (over which MD2, GD2, and MD3 are disposed) correspond to M1 of FIG. 1C.

The fuse cell 200 includes a number of conductive structures of an Mx layer extending in the second lateral direction and spaced from each other in the first lateral direction. In some embodiments, the Mx layer is metal 0 (M0) layer or any of other various metal layers. As shown in FIG. 2, the conductive structures of the Mx layer include a conductive structure bit line (BL) Mx, a conductive structure bit line bar (BLB) Mx, a conductive structure VSS, a conductive structure WL, and a conductive structure NCGATE. In some embodiments, BL Mx and BLB Mx are adjacent to each other (e.g., next to each other with no other similar structures in between) along the first lateral direction. In some embodiments, BL Mx is at a first end, along the first lateral direction, of the MDs, BLB Mx is in between BL Mx and Vss, Vss is in between BLB Mx and WL, WL is in between VSS and NCGATE, and NCGATE is at the other end of the MDs. In some embodiments, a width, MxW, of each of the conductive structures of the Mx layer is in a range from 10 nm to 30 nm, or any of other various values. In some embodiments, a spacing, MxSp, between each pair of adjacent ones of the conductive structures of the Mx layer is in a range from 10 nm to 30 nm, or any of other various values. Each of the conductive structures of the Mx layer can include Cu Al, Co, Ru, W, or any of other various conductive materials.

In some embodiments, BL Mx and BLB Mx are at least partially disposed over OD. In some embodiments, the conductive structure BL Mx is a physical structure corresponding to the BL of FIG. 1C and the conductive structure BLB Mx is a physical structure corresponding to the BLB of FIG. 1C. In some embodiments, the fuse cell 200 includes a dielectric DIEL in between, and in contact with (e.g., coupling), BL Mx and BLB Mx along the second lateral direction. In some embodiments, a channel is formed (e.g., the dielectric DIEL creates a channel) in response to a voltage being applied to BL Mx or another conductor electrically coupled to BL Mx. In some embodiments the applied voltage has a voltage level that is greater than a threshold (e.g., a dielectric breakdown voltage threshold) for forming the channel. In some embodiments, a first resistance of the channel is lower than a second resistance of the dielectric DIEL.

In some embodiments, one or more of VSS, WL, and NCGATE are at least partially disposed over OD, while in other embodiments, VSS, WL, and NCGATE are not disposed over OD. In some embodiments, the conductive structure VSS is a physical structure corresponding to the VSS of FIG. 1C, the conductive structure WL is a physical structure corresponding to the WL of FIG. 1C, and the conductive structure NCGATE is a physical structure corresponding to the NCGATE of FIG. 1C. Although the fuse cell 200 illustrated in FIG. 2 includes two conductive structures of the Mx layer, it should be understood that the fuse cell 104 can include any number of conductive structures of the Mx layer while remaining within the scope of the present disclosure.

The fuse cell 200 includes a number of vias (VDs), wherein each of the number of VDs is disposed, along the vertical direction, in between a corresponding conductive structure of the Mx layer and a corresponding MD structure. As shown in FIG. 2, a first VD is in between BLB Mx and MD1, a second VD is in between VSS and MD3, and a third VD is in between BLB Mx and MD5. In some embodiments, each VD electrically couples, and is in contact with, the corresponding MD structure and the corresponding conductive structure of the Mx layer that it is disposed therebetween. Although the fuse cell 200 illustrated in FIG. 2 includes three VDs, it should be understood that the layout circuit 200 can include any number of VDs while remaining within the scope of the present disclosure. Each of the VDs can include Cu Al, Co, Ru, W, or any of other various conductive materials.

The fuse cell 200 includes a number of vias (VGs) wherein each of the number of VGs is disposed, along the vertical direction, in between a corresponding conductive structure of the Mx layer and corresponding GD structure. As shown in FIG. 2, a first VG is in between NCGATE and GD1, a second VG is in between WL and GD2, a third VG is in between WL and GD3, and a fourth VG is in between NCGATE and GD4. In some embodiments, each GD electrically couples, and is in contact with, the corresponding GD structure and the conductive structure of the Mx layer that it is disposed therebetween. Although the fuse cell 200 illustrated in FIG. 2 includes two VGs, it should be understood that the layout circuit 200 can include any number of VGs while remaining within the scope of the present disclosure. Each of the VGs can include Cu Al, Co, Ru, W, or any of other various conductive materials.

The fuse cell 200 includes a number of conductive structures of an My layer extending in the first lateral direction and spaced from each other in the second lateral direction. In some embodiments, the My layer is metal 1 (M1) layer or any of other various metal layers. In some embodiments, My is a metal layer disposed over and adjacent to Mx. That is, in some embodiments, there is no other metal layer in between Mx and My, but there can be a via layer. In some embodiments, each of the conductive structures of the My layer is partially disposed over one or more of the conductive structures of the Mx layer. In some embodiments, each of the conductive structures of the My layer is disposed or partially disposed over a corresponding MD. Although not shown, in some embodiments, one or more of the conductive structures of the My layer are not disposed over a corresponding MD or are partially disposed over two or more MDs.

As shown in FIG. 2, the conductive structures of the My layer include conductive structures BL My, BLB My, BL My2, BLB My2, and BL My3. In some embodiments, BL My is at one end, along the second lateral direction, of the conductive structures at the My layer, BLB My is in between BL My and BL My2, BL My2 is in between BLB My and BLB My2, BLB My2 is in between BL My2 and BL My3, and BL My3 is at the other end of the conductive structures of the My layer.

In some embodiments, a width, MyW, of each of the conductive structures of the My layer is in a range from 10 nm to 30 nm, or any of other various values. In some embodiments, a spacing, MySp, between each two adjacent ones of the conductive structures of the My layer is in a range from 10 nm to 30 nm, or any of other various values. Each of the conductive structures of the My layer can include Cu Al, Co, Ru, W, or any of other various conductive materials.

In some embodiments, each of the conductive structures BL (e.g., BL My, BL My2, and BL My3) is a physical structure that corresponds to the BL of FIG. 1C and each of the conductive structures BLB (e.g., BLB My and BLB My2) is a physical structure that corresponds to the BLB of FIG. 1C. Although the fuse cell 200 illustrated in FIG. 2 includes five conductive structures of the My layer, it should be understood that the layout circuit 200 can include any number of conductive structures of the My layer while remaining within the scope of the present disclosure.

The fuse cell 200 includes a number of vias (Vxs) disposed, along the vertical direction, in between a corresponding conductive structure of the Mx layer and a corresponding conductive structure of the My layer. As shown in FIG. 2, a first Vx is in between BL Mx and BL My, a second Vx is in between BLB Mx and BLB My, a third Vx is in between BL Mx and BL My2, a fourth Vx is in between BLB Mx and BLB My2, and a fifth Vx is in between BL Mx and BL My3. In some embodiments, each Vx electrically couples, and is in contact with, the corresponding conductive structure of the Mx layer and the corresponding conductive structure of the My layer that it is disposed therebetween. In some embodiments, each via Vx is only partially disposed over its respective conductive structure of the Mx layer (e.g., a width, along the first lateral direction, of the via along the first lateral direction is greater than a width, along the first lateral direction, of the corresponding conductive structure of the Mx layer). In some embodiments, one or more of the Vx vias may be aligned (e.g., centered), along the first direction, with respect to the corresponding conductive structures of the Mx layer. In some embodiments, one or more of the Vx vias may be offset (e.g., not centered), along the first direction, with respect to the corresponding conductive structures of the Mx layer.

In some embodiments, the dielectric DIEL that is in the Mx layer is also in the Vx layer. In some embodiments, DIEL is disposed over BLB Mx and disposed in between each Vx and BLB Mx. In some embodiments, a width, VxW, of each of the vias Vx is in a range from 10 nm to 30 nm, or any of other various values. In some embodiments, a length, VxL, of each of the vias Vx is in a range from 10 nm to 30 nm, or any of other various values. In some embodiments, VxW is equal to VxL such that Vx is square shaped in a plane along the first and second lateral directions. In some embodiments, VxW differs from VxL such that Vx is rectangular shaped in a plane along the first and second lateral directions. Although the fuse cell 200 illustrated in FIG. 2 includes five Vxs, it should be understood that the layout circuit 200 can include any number of Vxs while remaining within the scope of the present disclosure. Each of the vias Vx can include Cu Al, Co, Ru, W, or any of other various conductive materials.

Figures 3A, 3B:
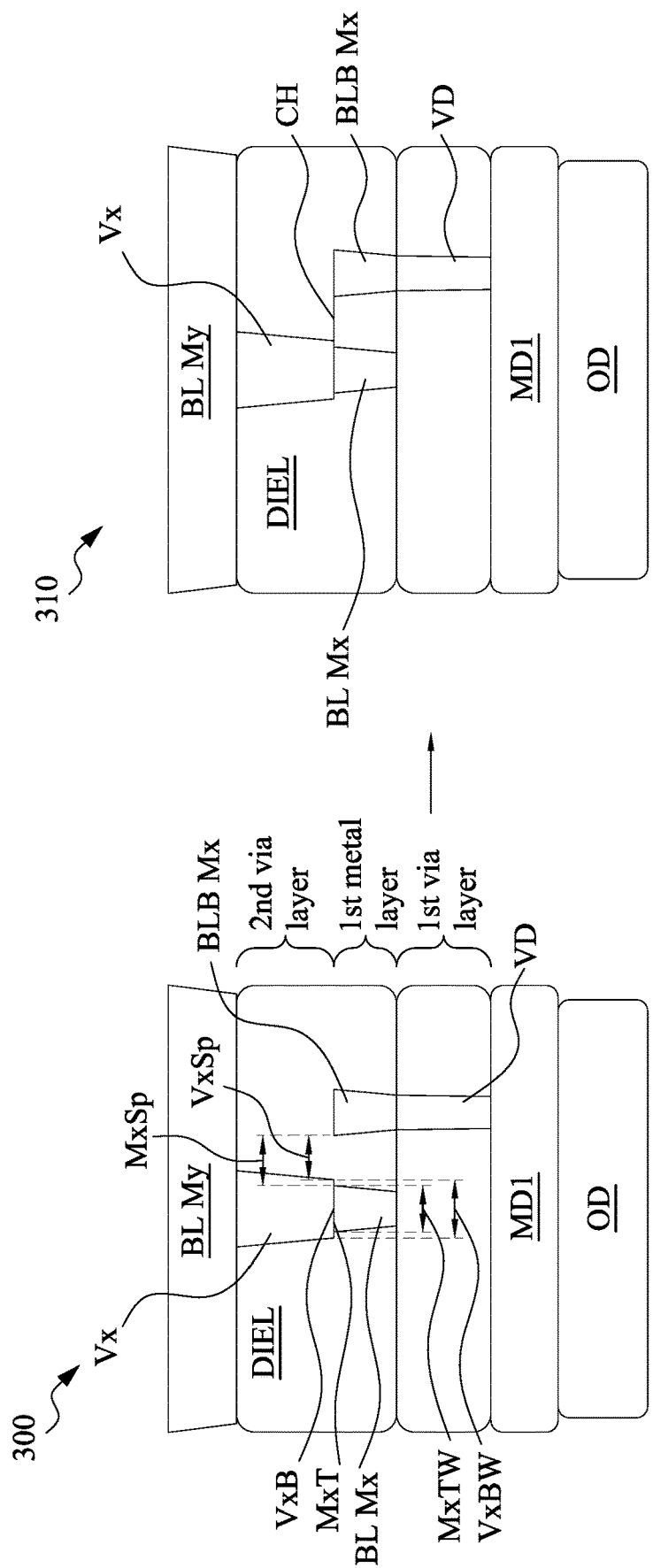
FIGS. 3A and 3B each illustrate a cross-section view of a fuse structure at various stages of operation, in accordance with some embodiments.

FIG. 3A illustrates a fuse structure 300, in accordance with various embodiments. The fuse structure 300 is a cross-sectional view of various layers of the fuse cell 200, cut along A-A', in accordance with various embodiments. As shown in FIG. 3A, the fuse structure 300 includes the active structure OD. In some embodiments, the metal-defined structure MD1 is disposed over the active structure OD. In some embodiments, a first via layer is disposed over the metal-defined structure MD1. In some embodiments, the via structure VD is disposed in the first via layer. In some embodiments, a first metal layer (e.g., metal 0 layer) is disposed over the first via layer. In some embodiments, the conductive structures BL Mx and BLB Mx are disposed in the first metal layer. In some embodiments, the conductive structure BLB Mx is disposed over the via structure VD. In some embodiments, BL Mx and BLB Mx are spaced from each other in the first lateral direction (e.g., the Y direction). In some embodiments, a top surface (e.g., top critical dimension), MxT, of the conductive structure BL Mx, has a width, MxTW, in a range of 10 nm to 30 nm, or any of other various values.

In some embodiments, a second via layer (e.g., via 0 layer) is disposed over the first metal layer. In some embodiments, the via structure Vx is disposed in the second via layer and over the conductive structure BL Mx. In some embodiments, Vx is wider than BL Mx. In some embodiments, a bottom surface (e.g., bottom critical dimension), VxB, of the conductive structure Vx, has a width, VxBW, in a range of 10 nm to 30 nm, or any of other various values. In some embodiments, VxBW is greater than MxTW by a range including 1 nm to 4 nm (e.g., on one or both sides), or any of other various values. VxBW can be made greater than MxTW by process adjustment. In some embodiments, a first spacing (e.g., space, distance) between Vx and BLB Mx (VxSp) is in a range from 6 nm to 30 nm, or any of other various values. In some embodiments, a second spacing between BL Mx and BLB Mx (MxSp) is in a range from 10 nm to 30 nm, or any of other various values. In some embodiments, a ratio of VxSp and MxSp is in a range between 0.4 to 1 (e.g., 0.4 to 0.9, 0.4 to 0.7, or 0.4 to 0.5), or any of other various values.

In some embodiments, the via structure Vx may be aligned, along the first lateral direction, with respect to the conductive structure BL Mx. In some embodiments, the via structure Vx may be offset, along the first lateral direction, with respect to the conductive structure BL Mx, such that a spacing between the via structure Vx and the conductive structure BLB Mx is less than a second spacing with the via structure Vx not offset with respect to the conductive structure BL Mx. In some embodiments, the conductive structure BLB Mx, the conductive structure BL Mx, and the via structure Vx may be collectively referred to as a fuse element. Advantageously, having a lower spacing between the via structure Vx and the conductive structure BLB Mx may result in requiring a lower voltage for programming the fuse element.

The dielectric DIEL is disposed in the first metal layer and the second via layer. The dielectric DIEL is disposed in between the conductive structure BLB Mx and BL Mx, in between the conductive structure BLB Mx and the via structure Vx, as well as over the conductive structure BLB Mx. In some embodiments, a second metal layer (e.g., metal 1 layer) is disposed over the second via layer. In some embodiments, the conductive structure BL My is disposed in the second metal layer and over the via structure Vx. Although not shown, other metal and via layers are within the scope of the disclosure.

FIG. 3B illustrates a fuse structure 310, in accordance with various embodiments. The fuse structure 310 is a cross-sectional view of various layers of the fuse cell 200, cut along A-A', in accordance with various embodiments. In some embodiments, the fuse structure 310 corresponds to the fuse cell 160 (e.g., a fuse cell after programming) of FIG. 1D. In some embodiments, the fuse structure 310 is similar to the fuse structure 300 except for the differences described herein. In some embodiments, the fuse structure 310 includes a channel CH disposed in between the via structure Vx and the conductive structure BLB Mx. The channel CH may electrically couple the via structure Vx to the conductive structure BLB Mx. In some embodiments, the channel CH corresponds to R1 of FIG. 1D. Each of the fuse structures 300-310 can be described as a semiconductor device while remaining within the scope of the present disclosure.

Figure 4:
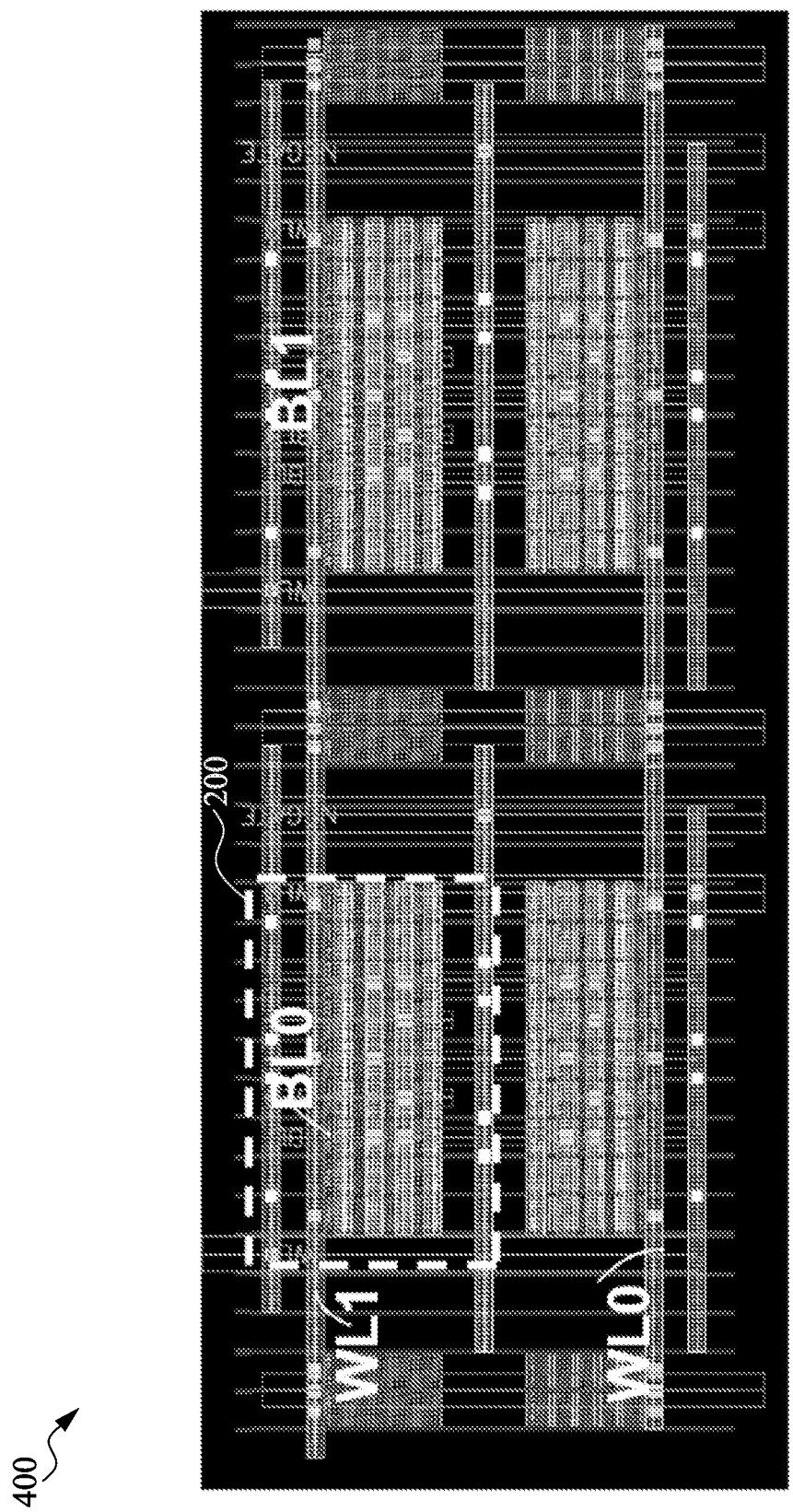
FIG. 4 illustrates a circuit layout of an array of a number of the fuse cells 200, in accordance with some embodiments.

FIG. 4 illustrates a circuit layout of an array 400 of a number of the fuse cells such as the fuse cell 200, in accordance with some embodiments. In some embodiments, the array 400 is a 2×2 array of the fuse cell 200. In some embodiments, the fuse cells are arranged in a row-column configuration, in which bit lines and bit bar lines extend in the first lateral direction (e.g., the Y direction) to couple to fuse cells in that column and a word line extends in the second lateral direction (e.g., the X direction) to couple to the fuse cells in that row. For example, BL0 extends along the first lateral direction to couple to each of the fuse cells 200 in a first column, BL1 extends along the first lateral direction to couple to each of the fuse cells 200 in a second column, WL0 extends along the second lateral direction to couple to each of the fuse cells 200 in a first row, and WL1 extends along the second lateral direction to couple to each of the fuse cells 200 in a second row. Although the array 400 in FIG. 4 is depicted as a 2×2 array, it should be understood that the array 400 can include any number fuse cells while remaining within the scope of the present disclosure.

FIGS. 5A-5F illustrate various circuit layouts of fuse cells 500-550, respectively, in accordance with some embodiments. In some embodiments, the fuse cells 500-550 are similar to the fuse cell 200 of FIG. 2 except for differences described herein. At a high level, the differences include a number of the vias disposed, an arrangement of the vias with respect to one another, and a shape of the vias. In some embodiments, the circuit layout of fuse cell 500 of FIG. 5A includes a number of Mx conductive structures (e.g., conductive structures of the Mx layer) extending in the second lateral direction (e.g., the X direction), a number of My conductive structures (e.g., conductive structures of the My layer) at least partially disposed over the number of Mx conductive structures extending in the first lateral direction (e.g., the Y direction), and a number of vias disposed therebetween, along the vertical direction. Other layout details are omitted for sake of brevity.

In some embodiments, the number of Mx conductive structures include BL Mx and BLB Mx spaced from BL Mx in the first lateral direction. In some embodiments, the number of My conductive structures include BL My, BLB My spaced from BL My in the first lateral direction, and BL My2 spaced from BLB My in the first lateral direction. In some embodiments, the vias are squared-shaped (e.g., a length of a via is equal to a width of the via). In some embodiments, the vias are arranged in a triangular arrangement in a plane along the first and second lateral directions. For example, a first Vx is disposed in between BL Mx and BL My, a second Vx is disposed in between BLB Mx and BLB My, and a third Vx is disposed between BL Mx and BL My2. Advantageously, having more vias (e.g., having a triangular arrangement) can reduce the via to metal breakdown voltage, as compared to having only one via. Moreover, having more vias can reduce the likelihood of a fuse cell being unprogrammable due to metal or via process defects (e.g., because it is less likely that all of the vias will be affected the same process defect). Although, as illustrated in FIG. 5A, the number of Mx conductive structures is two, the number of My conductive structures is three, and the number of vias is three, it should be understood that the fuse cell 500 can include any number of Mx conductive structures, My conductive structures, and Vx vias while remaining within the scope of the present disclosure.

In some embodiments, two fuse walls (FWs) are extending in the second lateral direction and are each spaced, along the first lateral direction, from a corresponding end one of the number of Mx conductive structures. In some embodiments, the FWs are floating (e.g., not coupled to any voltage/current/power/signal source/supply). In some embodiments, the FWs protect other circuits during breakdown of a fuse element in the fuse cell 500 by isolating the fuse cell 500 and preventing fuse material of the fuse cell 500 (e.g., the fuse element or the conductive structures) to be sputtered to the other circuits. The fuse material may include Cu, Co, or any of other various materials. Although, as illustrated in FIG. 5A, the number of FWs is two, it should be understood that the fuse cell 500 can include any number of FWs while remaining within the scope of the present disclosure.

In some embodiments, the fuse cell 510 of FIG. 5B is similar to the fuse cell 500 of FIG. 5A except for differences described herein. At a high level, the differences include that the vias are arranged in a parallelogram arrangement in a plane along the first and second lateral directions. In some embodiments, the fuse cell 510 includes an additional My conductive structure BLB My2 extending in the first lateral direction and spaced from BL My2 in the second lateral direction. In some embodiments, the fuse cell 510 includes an additional via structure (the third Vx) disposed, along the vertical direction, in between BLB Mx and BLB My2. Advantageously, having more vias (e.g., having a parallelogram arrangement) can reduce the via to metal breakdown voltage, as compared to having a 3-via, triangular arrangement. Moreover, having more vias can reduce the likelihood of a fuse cell being unprogrammable due to metal or via process defects. Although, as illustrated in FIG. 5B, the number of My conductive structures is four and the number of vias is four, it should be understood that the fuse cell 520 can include any number of My conductive structures and Vx vias while remaining within the scope of the present disclosure.

Figures 5C, 5D:
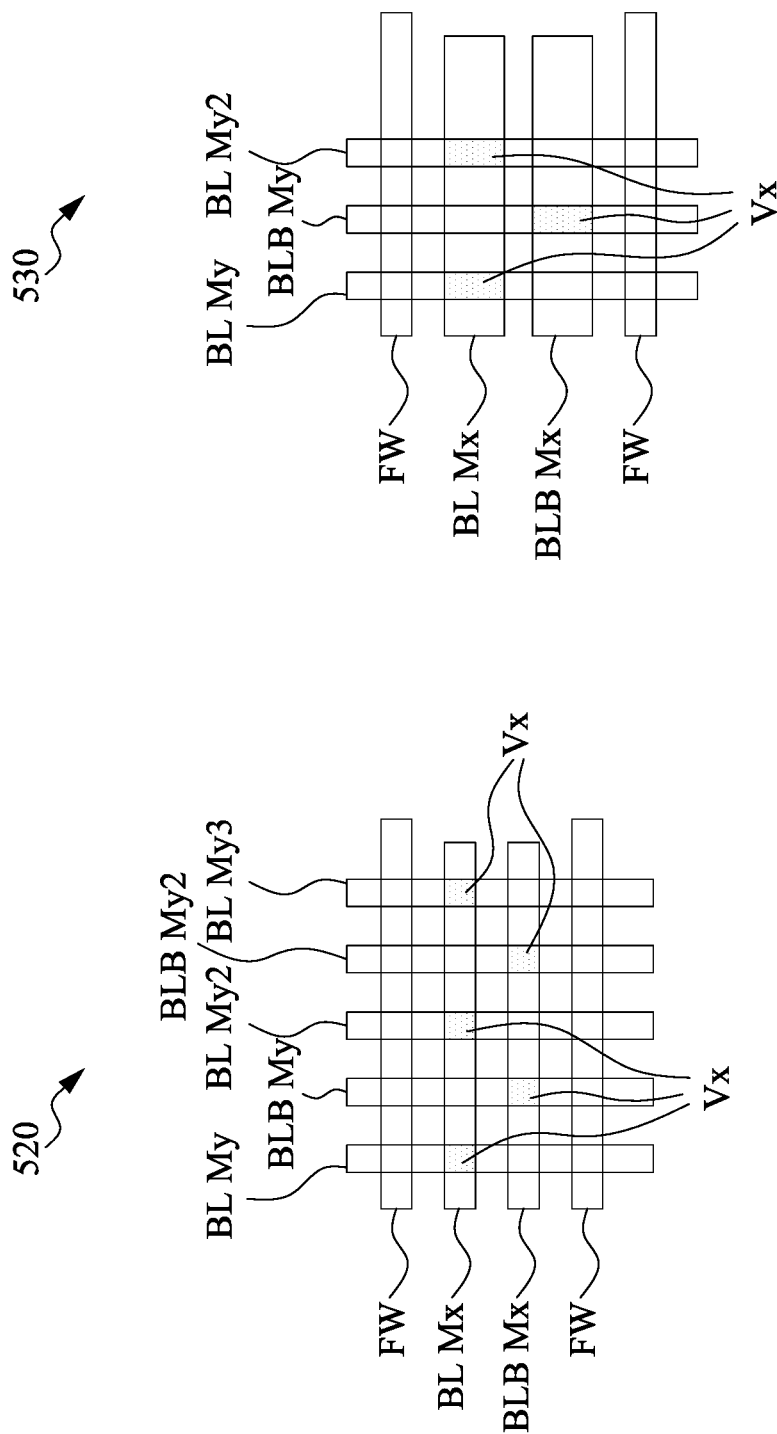

In some embodiments, the fuse cell 520 of FIG. 5C is similar to the fuse cell 510 of FIG. 5B except for differences described herein. At a high level, the differences include that the vias are arranged in a trapezoidal arrangement in a plane along the first and second lateral directions. In some embodiments, the fuse cell 520 includes an additional My conductive structure BL My3 extending in the first lateral direction and spaced from BLB My2 in the second lateral direction.

In some embodiments, the fuse cell 520 includes an additional via structure (the fourth Vx) disposed, along the vertical direction, in between BL Mx and BL My3. Advantageously, having more vias (e.g., having a trapezoidal arrangement) can reduce the via to metal breakdown voltage, as compared to having a 4-via, parallelogram arrangement. Moreover, having more vias can reduce the likelihood of a fuse cell being unprogrammable due to metal or via process defects. Although, as illustrated in FIG. 5C, the number of My conductive structures is five and the number of vias is five, it should be understood that the fuse cell 520 can include any number of My conductive structures, and Vx vias while remaining within the scope of the present disclosure.

In some embodiments, the Vx vias of fuse cells 500-520 are arranged in two or more rows (or columns), wherein the two or more rows (or columns) are offset from each other. That is, in some embodiments, a first plurality of the Vx via structures are arranged along the second lateral direction, wherein each of the first plurality of via structures is disposed over a different Mx conductive structure, and a second plurality of Vx via structures are arranged along the second lateral direction, spaced from the first plurality of via structures in the first lateral direction, and offset from the first plurality of via structures in the second lateral direction, wherein each of the second plurality of via structures is disposed over a different Mx conductive structure (e.g., different from each other and different from the Mx conductive structures over which the first plurality of via structures are disposed).

Figure 5F:
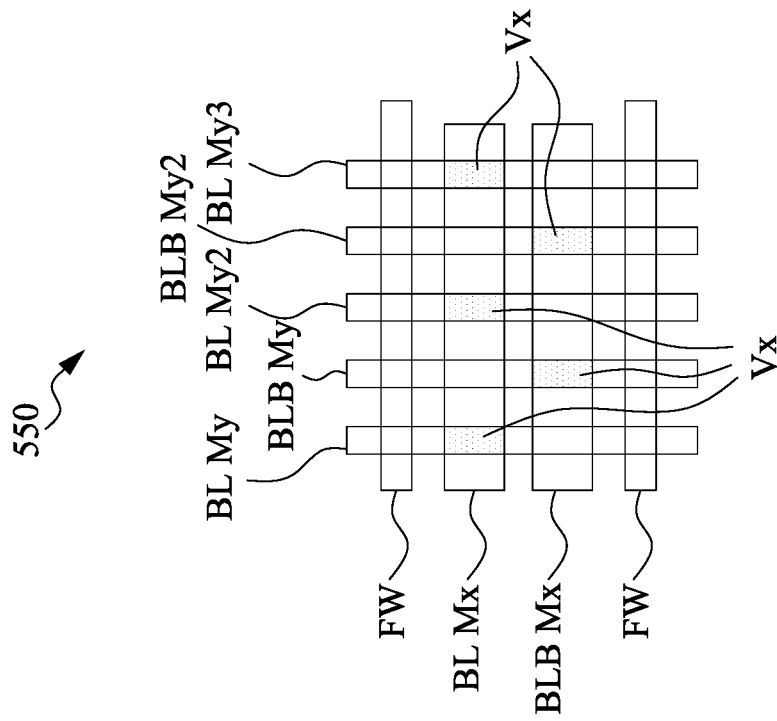
Figure 5E:
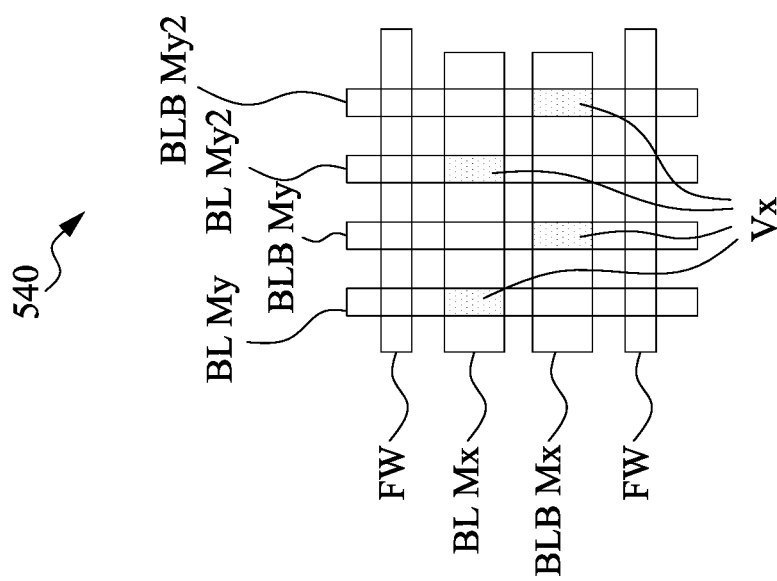

In some embodiments, the fuse cell 530 of FIG. 5D, the fuse cell 540 of FIG. 5E, and the fuse cell 550 of FIG. 5F are similar to the fuse cell 500 of FIG. 5A, the fuse cell 510 of FIG. 5B, and the fuse cell 520 of FIG. 5C, respectively, except that the Vx vias are rectangular-shaped rather than square-shaped and the corresponding Mx conductive structures are wider. Advantageously, having larger, rectangular-shaped vias can reduce the via to metal breakdown voltage by increasing the surface area of the via, as compared to square-shaped vias.

Figure 6:
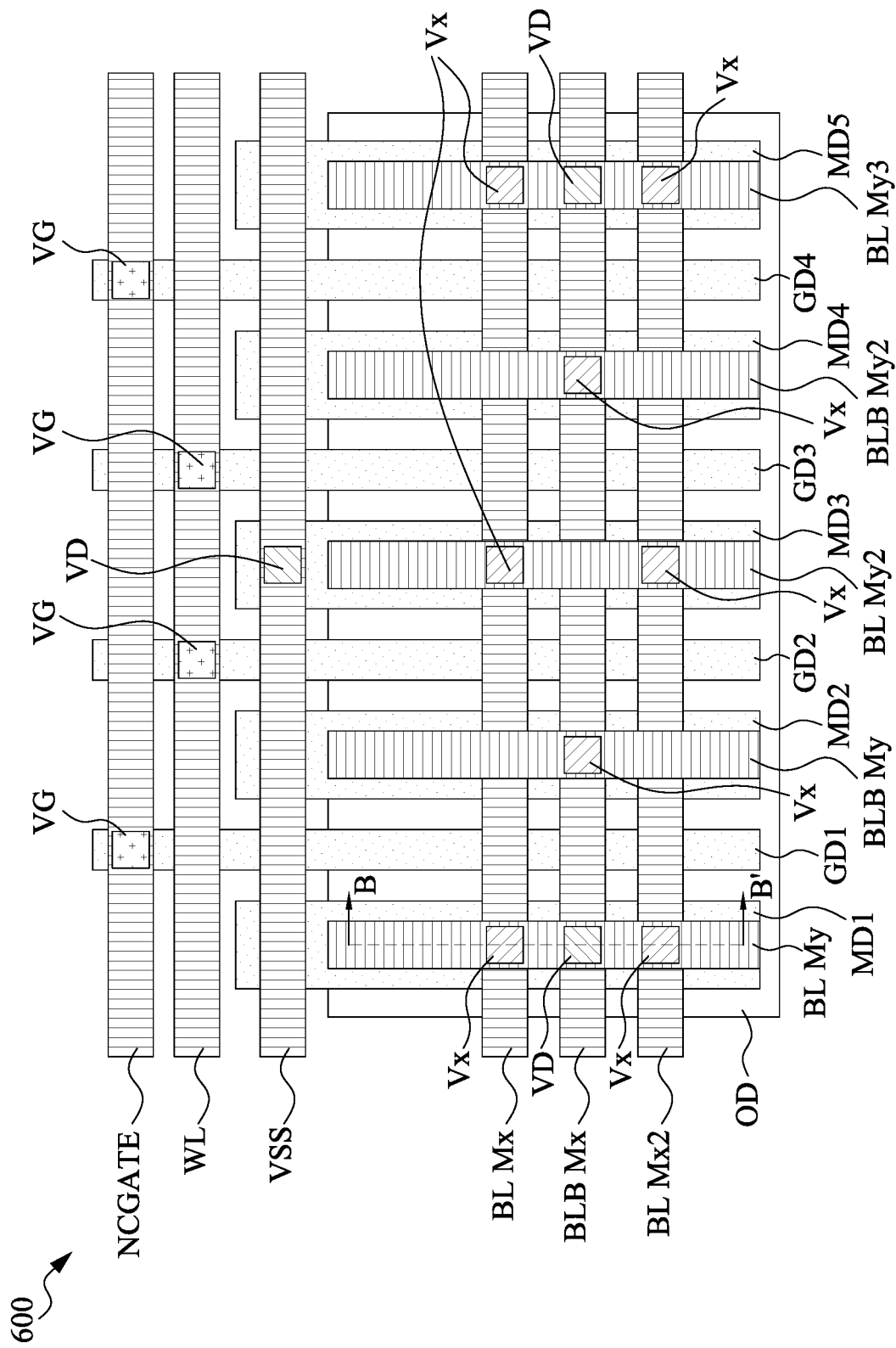
FIG. 6 illustrates a circuit layout of a fuse cell, in accordance with some embodiments.

FIG. 6 illustrates a circuit layout of a fuse cell 600, in accordance with various embodiments. In some embodiments, the fuse cell 600 is similar to the fuse cell 200 except for differences described herein. At a high level, the differences include an additional BL conductive structure disposed opposite the BLB from the first BL, wherein additional vias disposed along the additional BL conductive structure. In some embodiments, the fuse cell 600 includes, in addition to the conductive structures (e.g., BL Mx, BLB Mx) of the Mx layer of the fuse cell 200, a conductive structure BL Mx2 extending in the second lateral direction. In some embodiments, the conductive structure BL Mx2 is spaced from, in the first lateral direction (e.g., the Y direction), BLB Mx and disposed opposite BLB Mx from BL Mx (e.g., such that an order of the conductive structures along the first lateral direction is BL Mx, BLB Mx, and BL Mx2).

In some embodiments, the fuse cell 600 includes additional Vx vias in addition to the Vx vias of the fuse cell 200. As shown in FIG. 6, a sixth Vx is in between BL Mx2 and BL My, a seventh Vx is in between BL Mx2 and BL My2, and an eighth Vx is in between BL Mx2 and BL My3. Advantageously, having more vias (e.g., disposed along the additional BL conductive structure) can reduce the via to metal breakdown voltage, as compared to having only one BL conductive structure with vias disposed along it. Moreover, having more vias can reduce the likelihood of a fuse cell being unprogrammable due to metal or via process defects.

Figures 7A, 7B:
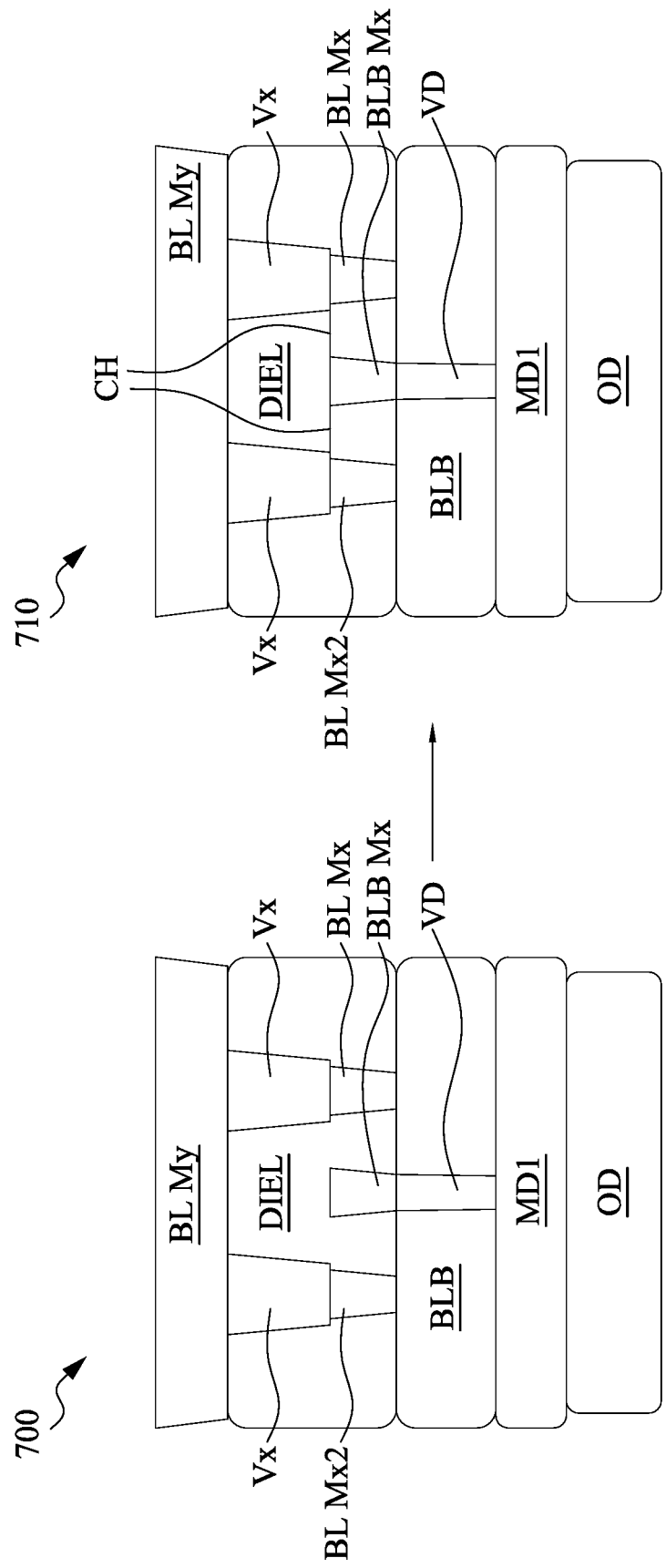
FIGS. 7A and 7B each illustrate a cross-section view of a fuse structure at various stages of operation, in accordance with some embodiments.
Figure 8B:
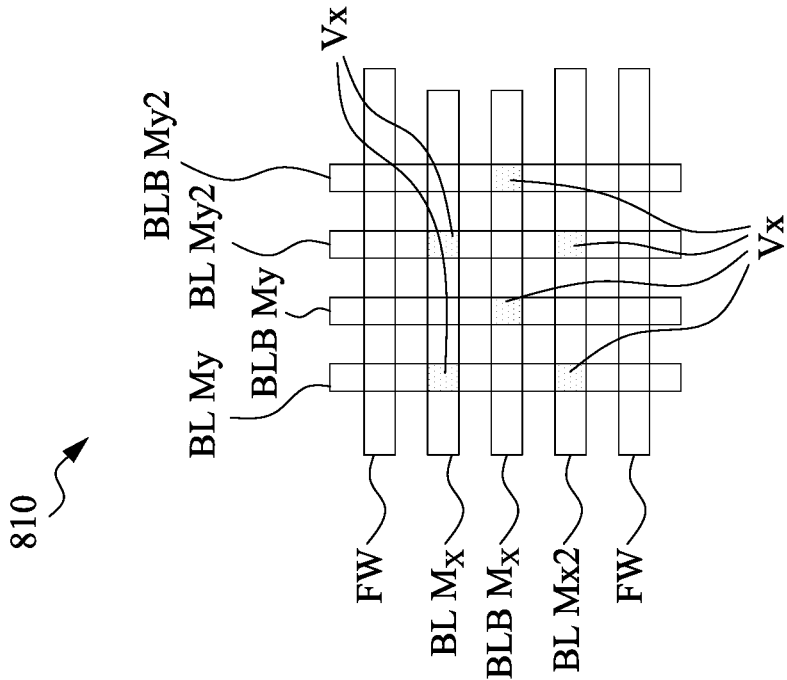
FIGS. 8A-8F illustrate various circuit layouts of a fuse cell, in accordance with some embodiments.
Figure 8A:
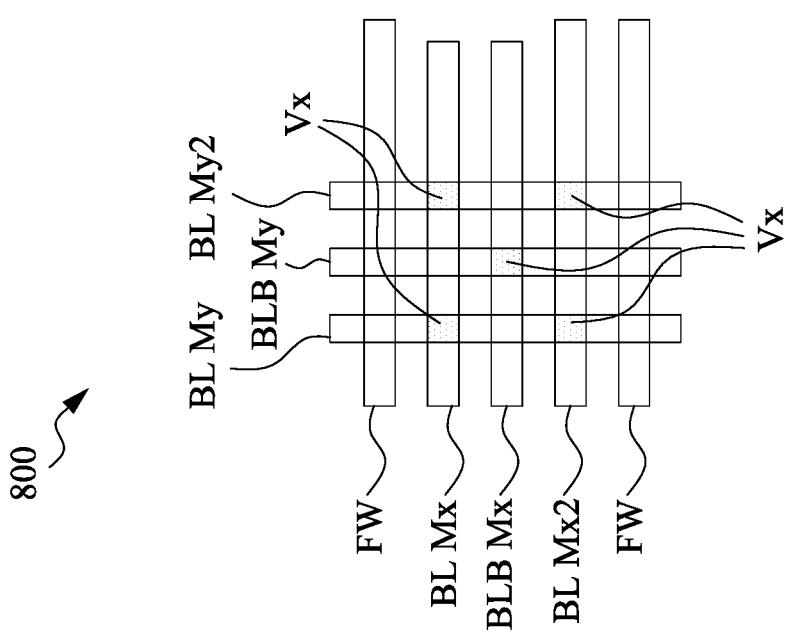
Figure 8D:
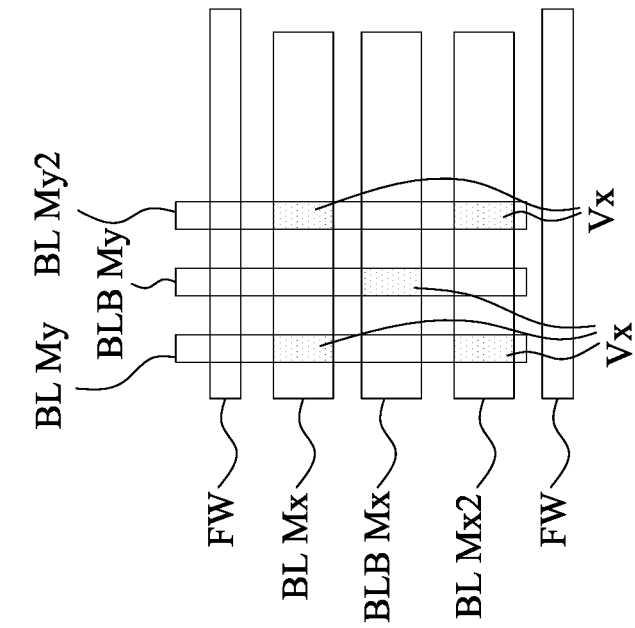
Figure 8C:
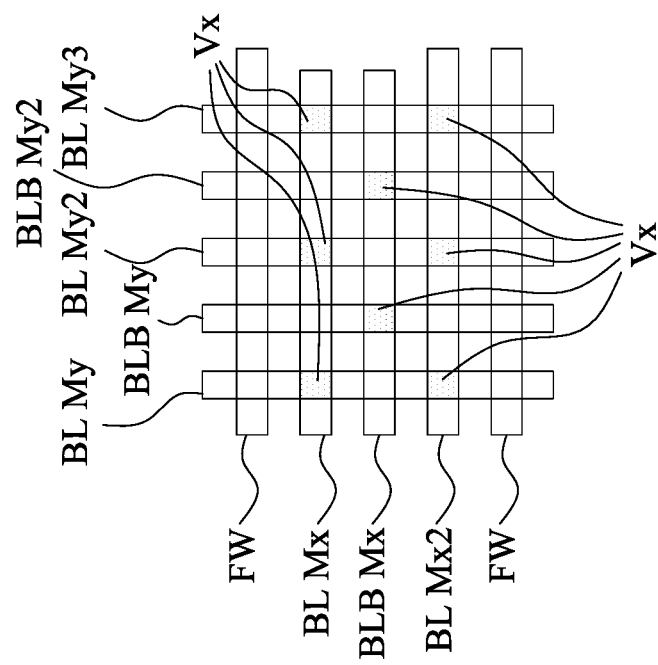
Figure 8F:
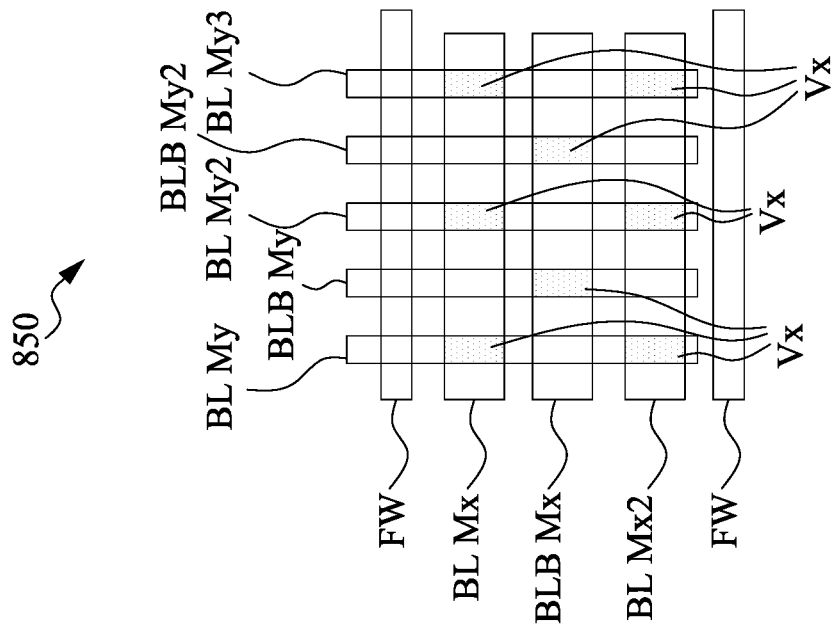
Figure 8E:
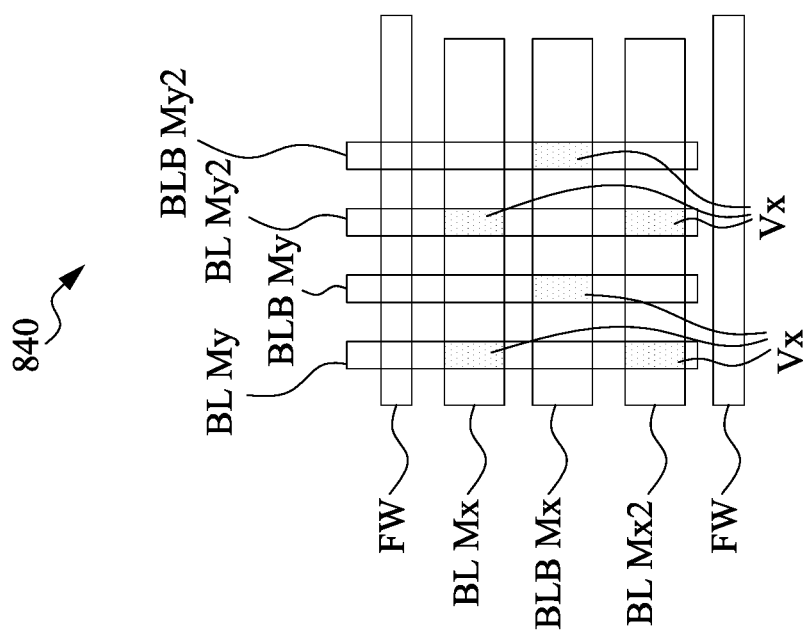

FIG. 7A illustrates a fuse structure 700, in accordance with various embodiments. The fuse structure 700 is a cross-sectional view of various layers of the fuse cell 600, cut along B-B', in accordance with various embodiments. In some embodiments, the fuse structure 700 is similar to the fuse structure 300 except for differences described herein. As shown in FIG. 7A, the conductive structure BL Mx2 is disposed in the first metal layer in addition to the conductive structures BL Mx and BLB Mx of fuse structure 300. In some embodiments, the conductive structure BL Mx2 is disposed opposite BLB Mx from BL Mx. In some embodiments, a second via structure Vx is disposed the second via layer in addition to the via structure Vx of fuse structure 300. In some embodiments, the second via structure Vx is disposed over the conductive structure BL Mx2. In some embodiments, the dielectric DIEL is disposed in between the conductive structure BLB Mx and BL Mx2, in between the conductive structure BLB Mx and the second via structure Vx, as well as over the conductive structure BLB Mx2.

FIG. 7B illustrates a fuse structure 710, in accordance with various embodiments. The fuse structure 700 is a cross-sectional view of various layers of the fuse cell 600, cut along B-B', in accordance with various embodiments. In some embodiments, the fuse structure 710 is similar to the fuse structure 310 except for differences described herein. In some embodiments, the fuse structure 710 includes the same differences that the fuse structure 700 includes. Additionally, in some embodiments, the fuse structure 710 includes a second channel CH disposed in between the via structure Vx and the conductive structure BLB Mx2.

FIGS. 8A-8F illustrate various circuit layouts of fuse cells 800-850, respectively, in accordance with some embodiments. In some embodiments, the fuse cells 800-850 are similar to the fuse cells 500-550 of FIG. 5A-5F, respectively, except for differences described herein. At a high level, the differences include an additional BL conductive structure disposed opposite the BLB from the first BL, wherein additional vias disposed along the additional BL conductive structure. In some embodiments, in addition to the Mx conductive structures (e.g., BL Mx, BLB Mx) of the respective one of the fuse cells 500-550, each of the fuse cells 800-850 includes an Mx conductive structure BL Mx2 extending in a second lateral direction (e.g., the X direction). In some embodiments, the Mx conductive structure BL Mx2 is opposite BLB Mx from BL Mx. In some embodiments, each the fuse cells 800-850 include two additional Vx vias. In some embodiments, the first additional Vx via is disposed in between BL Mx2 and BL My, and the second additional Vx via is disposed in between BL Mx2 and BL My2. In some embodiments, the fuse cells 820 and 850 include a third additional Vx via disposed in between BL Mx2 and BL My3. Advantageously, having more vias (e.g., disposed along the additional BL conductive structure) can reduce the via to metal breakdown voltage, as compared to having only one BL conductive structure with vias disposed along it. Moreover, having more vias can reduce the likelihood of a fuse cell being unprogrammable due to metal or via process defects.

Figure 9:
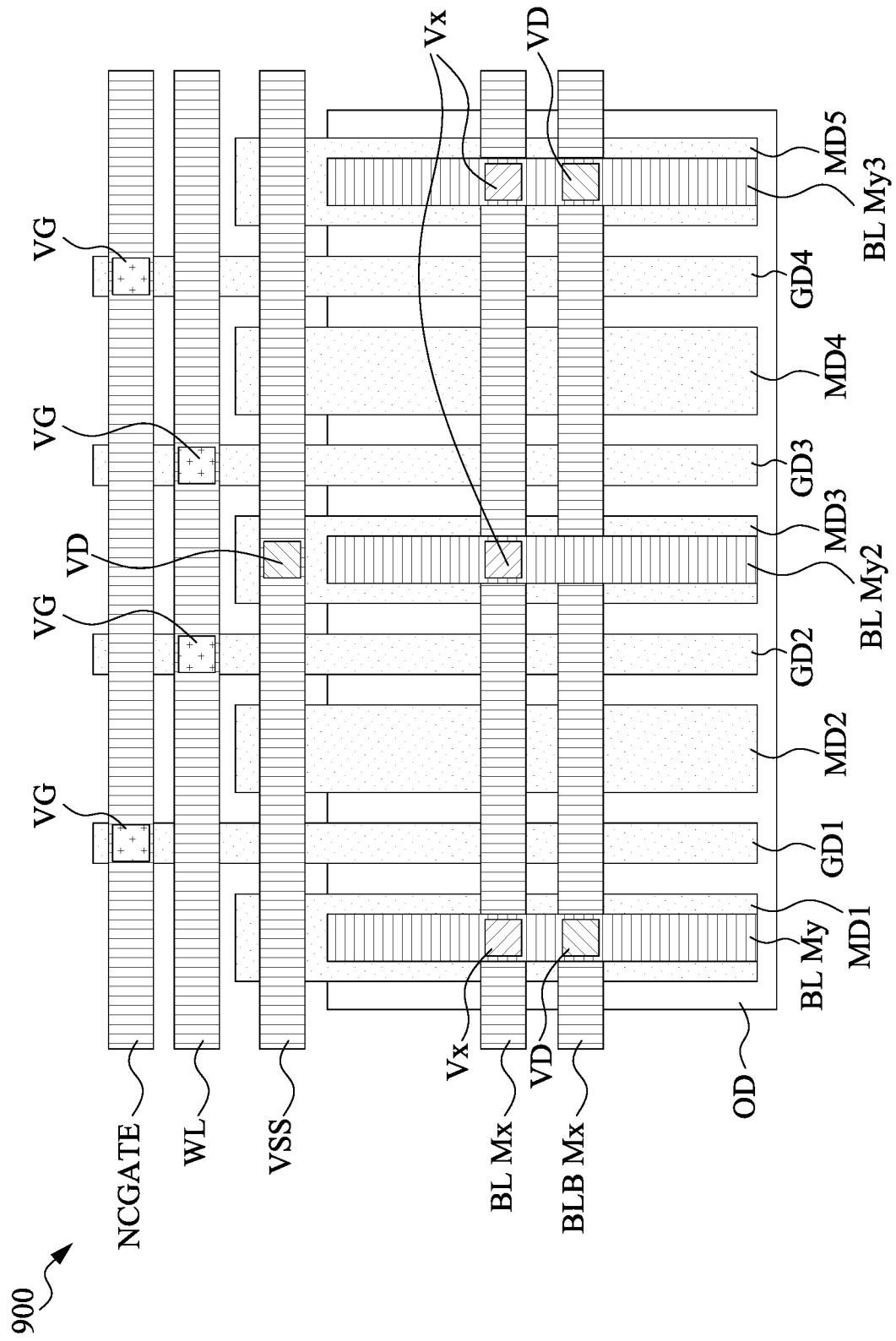
FIG. 9 illustrates a circuit layout of a fuse cell, in accordance with some embodiments.
Figures 10D, 10E, 10F:
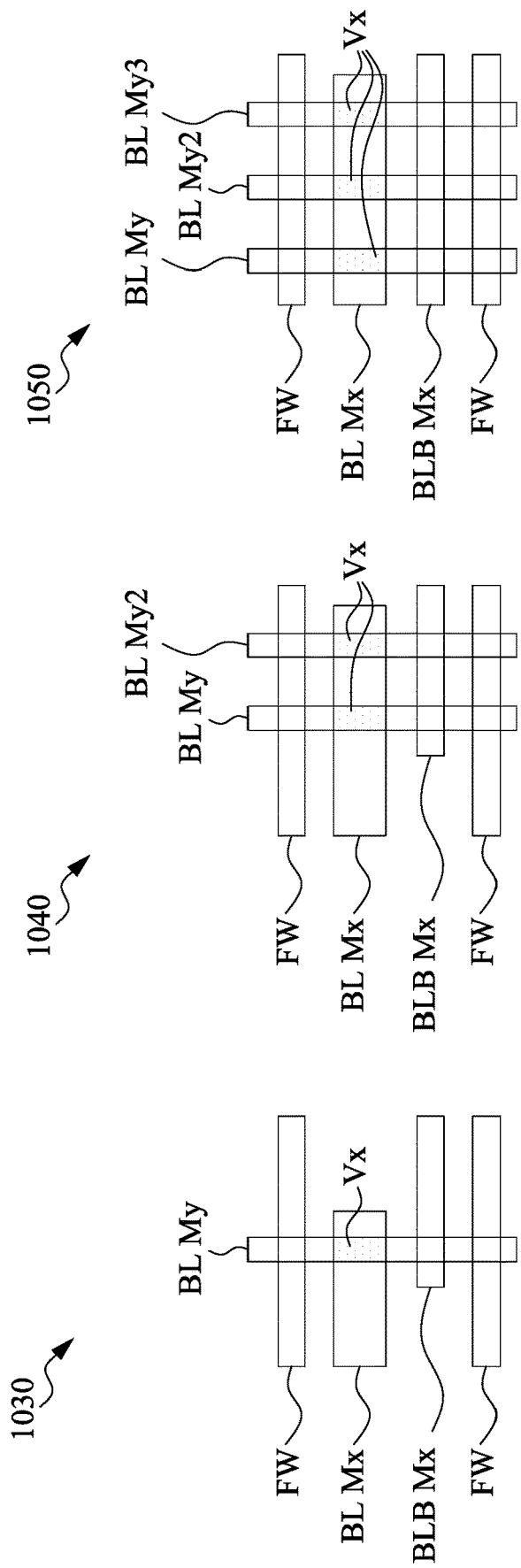

FIG. 9 illustrates a circuit layout of a fuse cell 900, in accordance with various embodiments. In some embodiments, the fuse cell 900 is similar to the fuse cell 200 except for differences described herein. In some embodiments, the conductive structures of the My layer BLB My and BLB My2 are omitted. In some embodiments, the number of Vx vias are arranged (e.g., in a single row) along the second lateral direction (e.g., the X direction). For example, the first Vx is in between BL Mx and BL My, the second Vx is in between BL Mx and BL My2, and the third Vx is in between BL Mx and BL and My3. In some embodiments, the Vx between BLB Mx and BLB My and the Vx between BLB Mx and BLB My2 are omitted. In some embodiments, the number of Vx vias are not disposed in between BLBs (e.g., BLB Mx, BLB My). In some embodiments, each of the number of Vx vias are only disposed in between corresponding BLs (e.g., BL Mx, BL My).

FIGS. 10A-10F illustrate various circuit layouts of fuse cells 1000-1050, respectively, in accordance with various embodiments. In some embodiments, the fuse cells 1000-1050 are similar to the fuse cells 500-550 of FIG. 5A-5F, respectively, except for differences described herein. In some embodiments, the fuse cells 1000-1050 omit the My conductive structures BLB My and BLB My2. In some embodiments, the fuse cells 1000-1050 omit the Vx disposed in between BLB Mx and BLB My in the fuse cells 800-850 and the Vx disposed in between BLB Mx and BLB My2 in the fuse cells 810, 820, 840, and 850.

Figure 11:
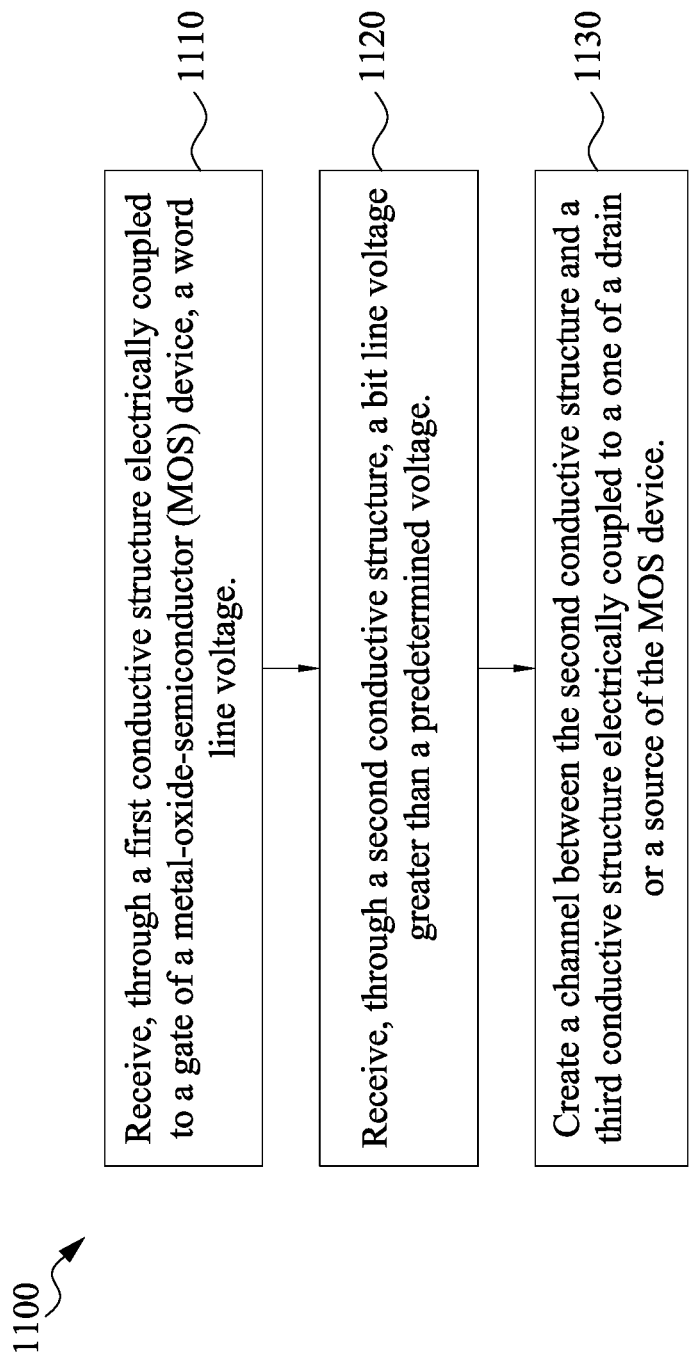
FIG. 11 illustrates a flow chart of an example method to operate a semiconductor device, in accordance with some embodiments.

FIG. 11 illustrates a flowchart of a method 1100 to operate a semiconductor device, according to one or more embodiments of the present disclosure. For example, at least some of the operations (or steps) of the method 1100 can be used to form the fuse cell 200 or the fuse structure 300. It is noted that the method 1100 is merely an example and is not intended to limit the present disclosure. Accordingly, it is understood that additional operations may be provided before, during, and after the method 1100 of FIG. 11, and that some other operations may only be briefly described herein.

The method 1100 starts with operation 1110 of receiving, through a first conductive structure (e.g., WL of FIG. 2) electrically coupled to a gate of a metal-oxide-semiconductor (MOS) device (e.g., M2 of FIG. 2), a word line voltage. The method 1100 continues to operation 1120 of receiving, through a second conductive structure (e.g., BL Mx or BL My of FIG. 2), a bit line voltage greater than a predetermined voltage.

In some embodiments, the method 1100 continues to operation 1130 of creating a channel (e.g., CH of FIG. 3B) between the second conductive structure and a third conductive structure (e.g., BLB Mx of FIG. 2) electrically coupled to one of a drain or a source of the MOS device. In some embodiments, the second conductive structure is electrically coupled to a via structure (e.g., Vx of FIG. 2) and the method includes creating the channel between the via structure and the third conductive structure. In some embodiments, the method 1100 includes sensing, through the second conductive structure, a second bit line voltage. In some embodiments, the second bit line voltage is less than a predetermined threshold indicating that the fuse cell has been programmed.

Figure 12:
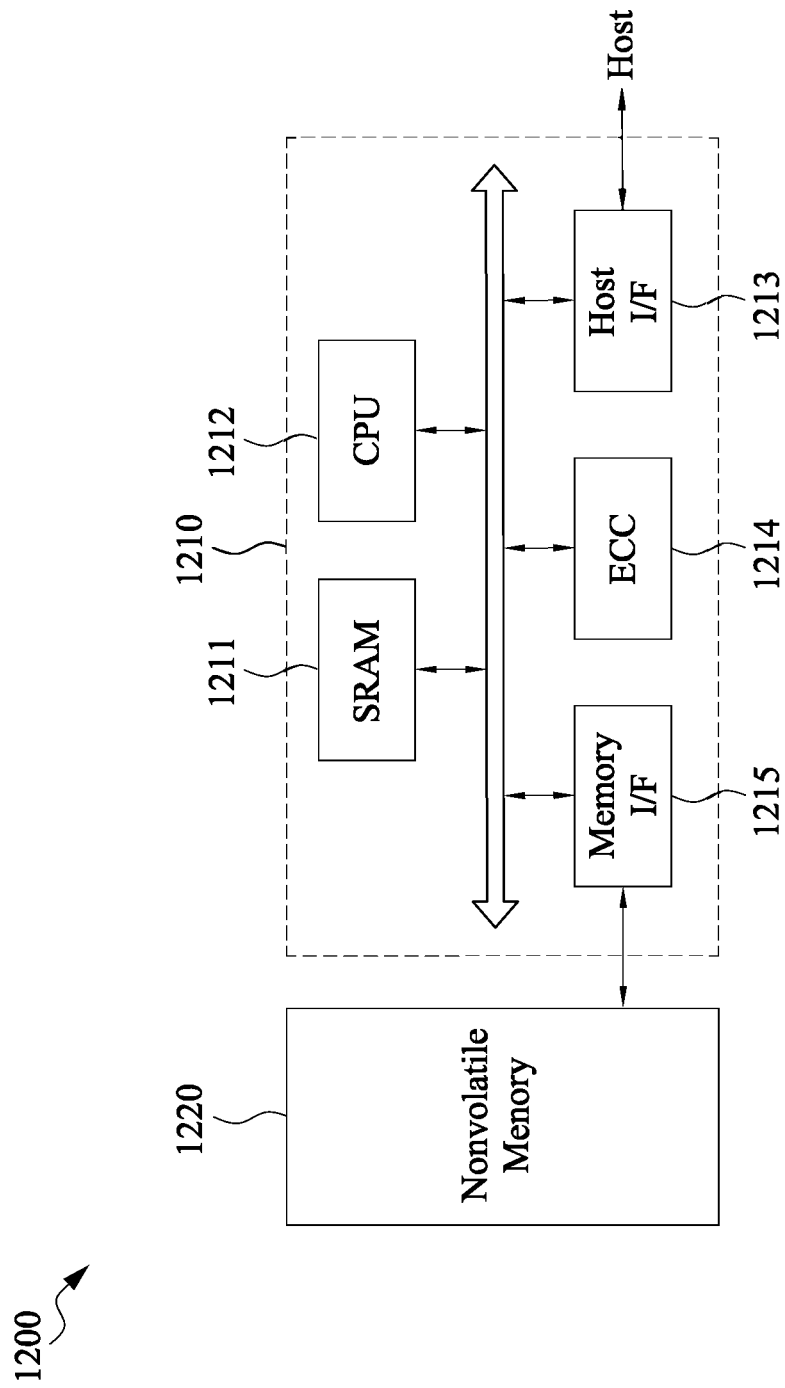
FIG. 12 is a block diagram showing the configuration of a memory system, in accordance with some embodiments.

FIG. 12 is a block diagram showing the configuration of a memory system, according to various embodiment of the present disclosure. As shown, a memory system 1200 according to various embodiments of the present disclosure includes a non-volatile memory device 1220 and a memory controller 1210.

The non-volatile memory device 1220 may include the array 400 of fuse cells such as the fuse cell 200, as disclosed herein. In addition, the non-volatile memory device 1220 may be a multi-chip package composed of a number of ferroelectric memory chips.

The memory controller 1210 is configured to control the non-volatile memory device 1220. The memory controller 1210 may include SRAM 1211, a central processing unit (CPU) 1212, a host interface (I/F) 1213, an error-correcting code (ECC) 1214, and a memory interface 1215. The SRAM 1211 functions as an operation memory of the CPU 1212. The CPU 1212 performs the general control operation for data exchange of the memory controller 1210. The host interface 1213 includes a data exchange protocol of a host being coupled to the memory system 1200. In addition, the ECC 1214 may detect and correct errors included in a data read from the non-volatile memory device 1220. The memory interface 1215 interfaces with the non-volatile memory device 1220. The memory controller 1210 may further store code data to interface with the host.

In one aspect of the present disclosure, a semiconductor device is disclosed. In some embodiments, the semiconductor device includes a first conductive structure extending in a first direction, the first conductive structure coupled to a metal-oxide-semiconductor (MOS) device; a second conductive structure extending in the first direction and spaced from the first conductive structure in a second direction perpendicular to the first direction; a dielectric material extending in the second direction and disposed over, in a third direction perpendicular to the first direction and the second direction, the first conductive structure; and a via structure disposed over the second conductive structure and in contact with the dielectric material, wherein the dielectric material is configured to create a channel between the first conductive structure and the via structure when a voltage is applied to the second conductive structure.

In some embodiments, the semiconductor device further includes a third conductive structure extending in the second direction and disposed over the via structure. In some embodiments, the semiconductor device further includes a fourth conductive structure extending in the first direction, spaced opposite the first conductive structure from the second conductive structure; and a second via structure disposed over the fourth conductive structure, wherein the third conductive structure is disposed over the second via structure.

In some embodiments, the semiconductor device further includes a second via structure disposed over the first conductive structure and spaced from the via in the first direction and the second direction; and a fourth conductive structure extending in the second direction, spaced from the third conductive structure in the first direction, and disposed over the second via structure.

In some embodiments, the semiconductor device further includes a first plurality of via structures arranged along the second direction, wherein each of the first plurality of via structures is disposed over a different conductive structure, wherein the third conductive structure is disposed over the plurality of via structures, wherein the first plurality of via structures includes the via structure; and a second plurality of via structures arranged along the second direction, spaced from the first plurality of via structures in the first direction, and offset from the first plurality of via structures in the second direction, wherein each of the second plurality of via structures is disposed over a different conductive structure, wherein the fourth conductive structure is disposed over the second plurality of via structures, wherein the second plurality of via structures includes the second via structure.

In some embodiments, the second conductive structure includes a first width in the second direction, the third conductive structure includes a second width in the first direction, the first width is equal to the second width, and the via structure is square-shaped in a plane along the first direction and the second direction. In some embodiments, the second conductive structure includes a first width in the second direction, the third conductive structure includes a second width in the first direction, and the first width is greater than the second width, and the via structure is rectangular-shaped in a plane along the first direction and the second direction.

In some embodiments, the via structure is aligned with the second conductive structure along the second direction. In some embodiments, the via structure is offset from the second conductive structure along the second direction. In some embodiments, the second conductive structure includes a first width in the second direction, the via structure includes a second width in the second direction, and the second width is greater than the first width.

In one aspect of the present disclosure, a semiconductor device is disclosed. In some embodiments, the semiconductor includes a first conductive structure extending in a first direction, the first conductive structure coupled to a metal-oxide-semiconductor (MOS) device; a second conductive structure extending in the first direction and spaced from the first conductive structure by a first spacing in a second direction perpendicular to the first direction; and a via structure disposed over the second conductive structure, wherein the via structure is spaced from the first conductive structure by a second spacing in the second direction and wherein a ratio of the second spacing to the first spacing is in a range between 0.4 to 0.9.

In some embodiments, the semiconductor device further includes a third conductive structure extending in the second direction and disposed over the via structure. In some embodiments, the semiconductor device further includes a fourth conductive structure extending in the first direction, spaced opposite the first conductive structure from the second conductive structure; and a second via structure disposed over the fourth conductive structure, wherein the third conductive structure is disposed over the second via structure.

In some embodiments, the semiconductor device further includes a second via structure disposed over the first conductive structure and spaced from the via in the first direction and the second direction; and a fourth conductive structure extending in the second direction, spaced from the third conductive structure in the first direction, and disposed over the second via structure.

In some embodiments, the second conductive structure includes a first width in the second direction, the third conductive structure includes a second width in the first direction, the first width of the second conductive structure is equal to the second width, and the via structure is square-shaped in a plane along the first direction and the second direction.

In some embodiments, the second conductive structure includes a first width in the second direction, the third conductive structure includes a second width in the first direction, the first width of the second conductive structure is greater than the second width, and the via structure is rectangular-shaped in a plane along the first direction and the second direction. In some embodiments, the via structure is aligned with the second conductive structure along the second direction. In some embodiments, the via structure is offset from the second conductive structure along the second direction.

In one aspect of the present disclosure, a method of operating a semiconductor device is disclosed. In some embodiments, the method includes receiving, through a first conductive structure electrically coupled to a gate of a metal-oxide-semiconductor (MOS) device, a word line voltage; receiving, through a second conductive structure, a bit line voltage greater than a predetermined voltage; and creating a channel between the second conductive structure and a third conductive structure electrically coupled to one of a drain or a source of the MOS device. In some embodiments, the method further includes sensing, through the second conductive structure, a second bit line voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a first conductive structure extending in a first direction, the first conductive structure connected to a drain electrode of a metal-oxide-semiconductor (MOS) device;
    a second conductive structure extending in the first direction, in parallel with the first conductive structure, and spaced from the first conductive structure in a second direction perpendicular to the first direction, wherein a gate electrode of the MOS device is connected to a conductive structure other than the first or second conductive structure;
    a dielectric material disposed over at least the first conductive structure; and
    a via structure disposed directly above the second conductive structure in a third direction perpendicular to the first and second directions and electrically coupled to the second conductive structure,
    wherein a channel is configured to be formed in the dielectric material to electrically short the second conductive structure and the first conductive structure when a voltage is applied to the second conductive structure.

2. The semiconductor device of claim 1, further comprising a third conductive structure extending in the second direction and disposed over the via structure.

3. The semiconductor device of claim 2, further comprising:
    a fourth conductive structure extending in the first direction, spaced opposite the first conductive structure from the second conductive structure; and
    a second via structure disposed over the fourth conductive structure, wherein the third conductive structure is disposed over the second via structure.

4. The semiconductor device of claim 2, further comprising:
    a second via structure disposed over the first conductive structure and spaced from the via in the first direction and the second direction; and
    a fourth conductive structure extending in the second direction, spaced from the third conductive structure in the first direction, and disposed over the second via structure.

5. The semiconductor device of claim 4, further comprising:
- a first plurality of via structures arranged along the second direction, wherein each of the first plurality of via structures is disposed over a different conductive structure, wherein the third conductive structure is disposed over the plurality of via structures, wherein the first plurality of via structures includes the via structure; and
- a second plurality of via structures arranged along the second direction, spaced from the first plurality of via structures in the first direction, and offset from the first plurality of via structures in the second direction, wherein each of the second plurality of via structures is disposed over a different conductive structure, wherein the fourth conductive structure is disposed over the second plurality of via structures, wherein the second plurality of via structures includes the second via structure.

6. The semiconductor device of claim 2, wherein the second conductive structure includes a first width in the second direction, the third conductive structure includes a second width in the first direction, the first width is equal to the second width, and the via structure is square-shaped in a plane along the first direction and the second direction.

7. The semiconductor device of claim 2, wherein the second conductive structure includes a first width in the second direction, the third conductive structure includes a second width in the first direction, and the first width is greater than the second width, and the via structure is rectangular-shaped in a plane along the first direction and the second direction.

8. The semiconductor device of claim 1, wherein the via structure is aligned with the second conductive structure along the second direction.

9. The semiconductor device of claim 1, wherein the via structure is offset from the second conductive structure along the second direction.

10. The semiconductor device of claim 1, wherein the second conductive structure includes a first width in the second direction, the via structure includes a second width in the second direction, and the second width is greater than the first width.

11. A semiconductor device comprising:
- a first conductive structure extending in a first direction, the first conductive structure connected to a drain electrode of a metal-oxide-semiconductor (MOS) device;
- a second conductive structure extending in the first direction and spaced from the first conductive structure by a first spacing in a second direction perpendicular to the first direction, wherein a gate electrode of the MOS device is connected to a conductive structure other than the first or second conductive structure; and
- a via structure disposed over the second conductive structure, wherein the via structure is spaced from the first conductive structure by a second spacing in the second direction and wherein a ratio of the second spacing to the first spacing is in a range between 0.4 to 0.9;
- wherein a channel is configured to be formed in a dielectric material to electrically short the second conductive structure and the first conductive structure when a voltage is applied to the second conductive structure.

12. The semiconductor device of claim 11, further comprising a third conductive structure extending in the second direction and disposed over the via structure.

13. The semiconductor device of claim 12, further comprising:
- a fourth conductive structure extending in the first direction, spaced opposite the first conductive structure from the second conductive structure; and
- a second via structure disposed over the fourth conductive structure, wherein the third conductive structure is disposed over the second via structure.

14. The semiconductor device of claim 12, further comprising:
- a second via structure disposed over the first conductive structure and spaced from the via in the first direction and the second direction; and
- a fourth conductive structure extending in the second direction, spaced from the third conductive structure in the first direction, and disposed over the second via structure.

15. The semiconductor device of claim 12, wherein the second conductive structure includes a first width in the second direction, the third conductive structure includes a second width in the first direction, the first width of the second conductive structure is equal to the second width, and the via structure is square-shaped in a plane along the first direction and the second direction.

16. The semiconductor device of claim 12, wherein the second conductive structure includes a first width in the second direction, the third conductive structure includes a second width in the first direction, the first width of the second conductive structure is greater than the second width, and the via structure is rectangular-shaped in a plane along the first direction and the second direction.

17. The semiconductor device of claim 12, wherein the via structure is aligned with the second conductive structure along the second direction.

18. The semiconductor device of claim 12, wherein the via structure is offset from the second conductive structure along the second direction.

19. The semiconductor device of claim 1, wherein the second conductive structure is spaced from the first conductive structure by a first spacing in the second direction and the via structure is space from the first conductive structure by a second spacing in the second direction.

20. The semiconductor device of claim 19, wherein a ratio of the second spacing to the first spacing is in a range between 0.4 to 0.9.

* * * * *